United States Patent
Lee et al.

(10) Patent No.: US 8,822,322 B2
(45) Date of Patent: Sep. 2, 2014

(54) SEMICONDUCTOR DEVICES AND METHODS OF FABRICATING THE SAME

(75) Inventors: Jaegoo Lee, Suwon-si (KR); Youngwoo Park, Seoul (KR); Jungdal Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 545 days.

(21) Appl. No.: 13/214,462

(22) Filed: Aug. 22, 2011

(65) Prior Publication Data

US 2012/0052674 A1 Mar. 1, 2012

(30) Foreign Application Priority Data

Aug. 30, 2010 (KR) .................. 10-2010-0084222

(51) Int. Cl.
*H01L 21/8239* (2006.01)
(52) U.S. Cl.
USPC .................. 438/591; 257/E21.645
(58) Field of Classification Search
CPC ............................... H01L 21/8239
USPC .................. 438/591; 257/E21.645
See application file for complete search history.

(56) References Cited

U.S. PATENT DOCUMENTS

| 2009/0146190 A1 | 6/2009 | Fukuzumi et al. |
| 2009/0242966 A1* | 10/2009 | Son et al. ............. 257/324 |
| 2009/0242967 A1 | 10/2009 | Katsumata et al. |

FOREIGN PATENT DOCUMENTS

| JP | 2008-171838 | 7/2008 |
| JP | 2009-135328 | 6/2009 |
| JP | 2009-224465 | 10/2009 |
| KR | 10-2009-0098733 A | 9/2009 |

* cited by examiner

*Primary Examiner* — Walter H Swanson
(74) *Attorney, Agent, or Firm* — Lee & Morse, P.C.

(57) ABSTRACT

A method of fabricating a semiconductor memory device includes forming a mold stack on a substrate and the mold stack including first sacrificial layers and second sacrificial layers alternately stacked on the substrate. The method also includes forming a plurality of vertical channels that penetrate the mold stack and that contact the substrate, patterning the mold stack to form word line cuts between the vertical channels, the word line cuts exposing the substrate, removing one of the first and second sacrificial layers to form recessed regions in the mold stack, forming a data storage layer, at least a portion of the data storage layer being formed between the vertical channels and the gates, forming gates in the recessed regions, forming air gaps between the gates by removing the other of the first and second sacrificial layers, and forming an insulation layer pattern in the word line cuts.

16 Claims, 34 Drawing Sheets

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2010-0084222, entitled "Semiconductor Devices and Methods of Fabricating the Same," filed on Aug. 30, 2010, the entirety of which is incorporated by reference herein.

BACKGROUND

Semiconductor devices are becoming more highly integrated to meet the requirements of customers, e.g., in order to provide high performance and low cost. The integration density of the semiconductor devices is a factor that may directly influence the cost of the semiconductor devices. Thus, the semiconductor devices have been continuously scaled down.

SUMMARY

Embodiments may be realized by providing a method of fabricating a semiconductor memory device that includes forming a mold stack on a substrate, the mold stack including first sacrificial layers and second sacrificial layers alternately stacked on the substrate. The method includes forming a plurality of vertical channels that penetrate the mold stack and that contact the substrate, patterning the mold stack to form word line cuts between the vertical channels, the word line cuts exposing the substrate, removing one of the first and second sacrificial layers to form recessed regions in the mold stack, forming a data storage layer, at least a portion of the data storage layer being formed between the vertical channels and the gates, forming gates in the recessed regions, forming air gaps between the gates by removing the other of the first and second sacrificial layers, and forming an insulation layer in the word line cuts.

The first sacrificial layers may be formed of silicon germanium layers and the second sacrificial layers may be formed of silicon nitride layers.

The recessed regions may be formed by removing the second sacrificial layers using a first etchant supplied through the word line cuts, and the gates may be formed by filling the recessed regions with a conductive material. The air gaps may be formed by removing the first sacrificial layers using a second etchant supplied through the word line cuts.

Forming the data storage layer may include sequentially forming a tunneling insulation layer, a trapping insulation layer, and a blocking insulation layer in the recessed regions before forming the gates therein or on sidewalls of vertical channel holes before forming the vertical channels therein. Forming the data storage layer may include forming a tunneling insulation layer on sidewalls of vertical channel holes before forming the vertical channels therein, forming a blocking insulation layer in the recessed regions before forming the gates therein, and forming a trapping insulation layer. The trapping insulation layer may be formed on the tunneling insulation layer after forming the tunneling insulation layer on the sidewalls of the vertical channel holes or may be formed in the recessed regions before forming the blocking insulation layer in the recessed regions.

Forming the insulation layer may include depositing an insulating material with a physical vapor deposition technique to contact the substrate. The method may include forming a plurality of vertical channel holes that penetrate the mold stack and expose the substrate, and oxidizing the first sacrificial layers exposed by the vertical channel holes to form a plurality of sacrificial oxide layers prior to forming the vertical channels in the vertical channel holes. The method may include forming a capping insulation layer on the mold stack.

Patterning the mold stack to form word line cuts may include patterning the capping insulation layer, forming the insulation layer pattern may include forming overhanging portions that overhang ends of the capping layer adjacent to the word line cuts, and the insulation layer may be spaced apart from the substrate and closing upper openings of the word line cuts. The method may include forming a protection layer on sidewalls of the vertical channels exposed by the air gaps.

Embodiments may also be realized by providing a semiconductor memory device that includes a plurality of bit lines on a substrate and spaced apart from each other in a first direction, the bit lines extending in a second direction that intersects the first direction, and a plurality of word lines between the substrate and the bit lines, the word lines being spaced apart from each other in the second direction and extending in the first direction. The semiconductor memory device includes a plurality of vertical channels at intersections of the bit lines and the word lines, the vertical channels being substantially perpendicular to a surface of the substrate, and a plurality of data storage layers between the word lines and the vertical channels. The word lines are spaced apart from each other along the vertical channels and are insulated from each other by air gaps.

The semiconductor memory device may include a protection layer covering sidewalls of the vertical channels adjacent to the air gaps. The protection layer may include an oxide layer of a silicon germanium.

The semiconductor memory device may include a word line cut extending in the first direction to expose the substrate and an insulation layer covering an upper portion of the word line cut to close the word line cut. The insulation layer may be in the word line cut, and having voids therein, contacting the substrate or the insulation layer may partially fill the upper portion of the word line cut and may be spaced apart from the substrate.

Embodiments may also be realized by providing a method of fabricating a semiconductor memory device that includes forming a mold stack on a substrate, the mold stack including first sacrificial layers and second sacrificial layers alternately stacked on the substrate, forming a plurality of vertical channels that penetrate the mold stack, patterning the mold stack to form word line cuts between the vertical channels, the word line cuts exposing the substrate, removing one of the first and second sacrificial layers to form recessed regions in the mold stack, filling a conductive material in the recessed regions, forming air gaps between the recessed regions filled with the conductive material by removing the other of the first and second sacrificial layers, and forming an insulation layer in the word line cuts to close the word line cuts, at least a portion of the word line cuts between an uppermost layer of the mold stack and the substrate being unfilled with the insulation layer.

Filling the conductive material in the recessed regions may include forming gates such that adjacent gates are spaced apart by one of the air gaps, the insulation layer, and a void in the word line cuts. Forming the insulation layer may include having the air gaps between the insulation layer and the vertical channels. The insulation layer may leave voids within the word line cuts. When closing the word line cuts, the insulation layer is spaced apart from the substrate to formed unfilled portions of the word line cuts and the air gaps are continuous with unfilled portions of the word line cuts.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1A:
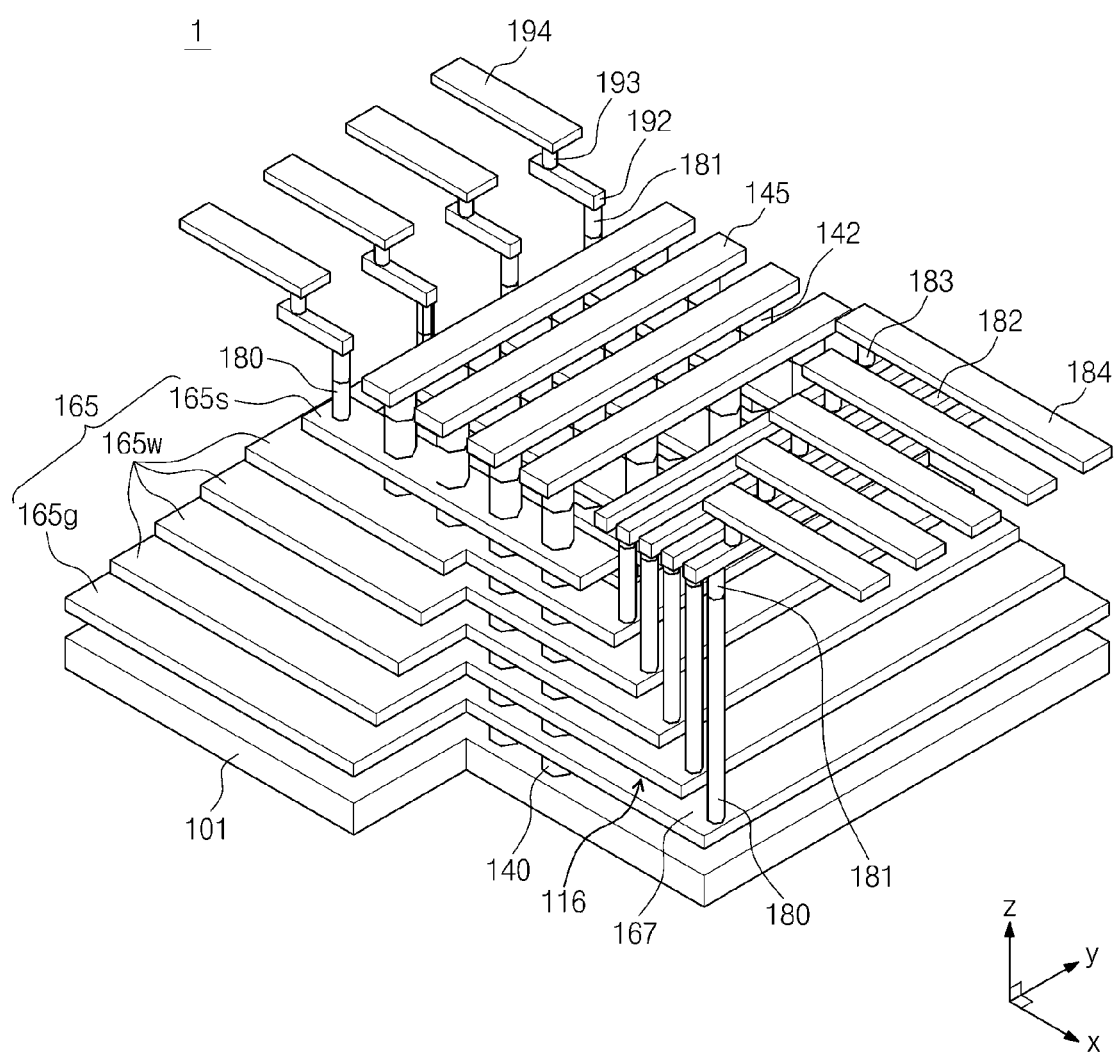
FIGS. 1A and 1B illustrate a semiconductor device, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

The term "and/or" includes any and all combinations of one or more of the associated listed items. It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Embodiments in the detailed description will be described with sectional views as exemplary views of the embodiments. Accordingly, shapes of the exemplary views may be modified according to, e.g., manufacturing techniques and/or allowable errors. Therefore, the embodiments are not limited to the specific shapes illustrated in the exemplary views, but may include other shapes that may be created according to manufacturing processes. Areas exemplified in the drawings have general properties, and are used to illustrate exemplary shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings. Exemplary embodiments explained and illustrated herein include their complementary counterparts. Like reference numerals refer to like elements throughout the specification.

Device Exemplary Embodiments

Figure 1B:
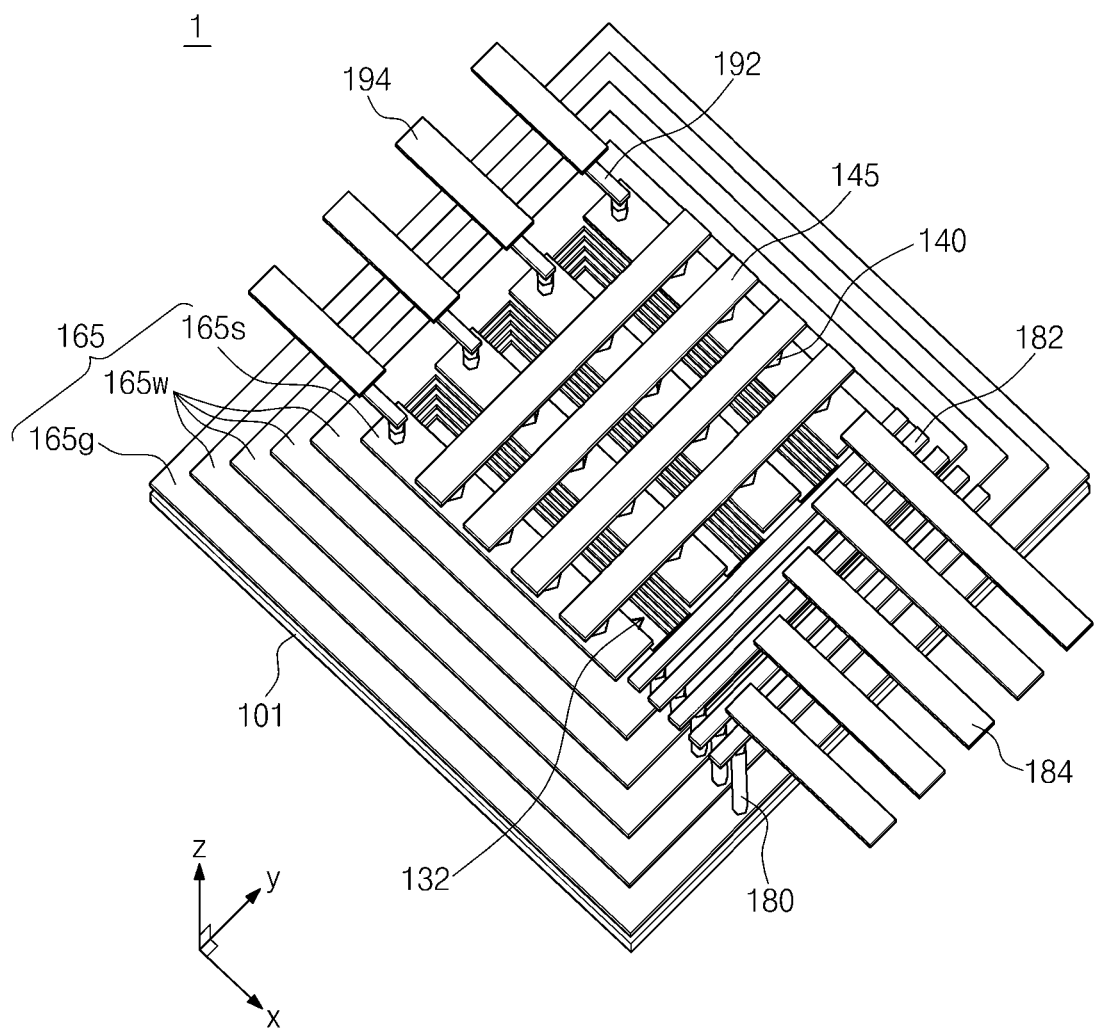
Figure 1C:
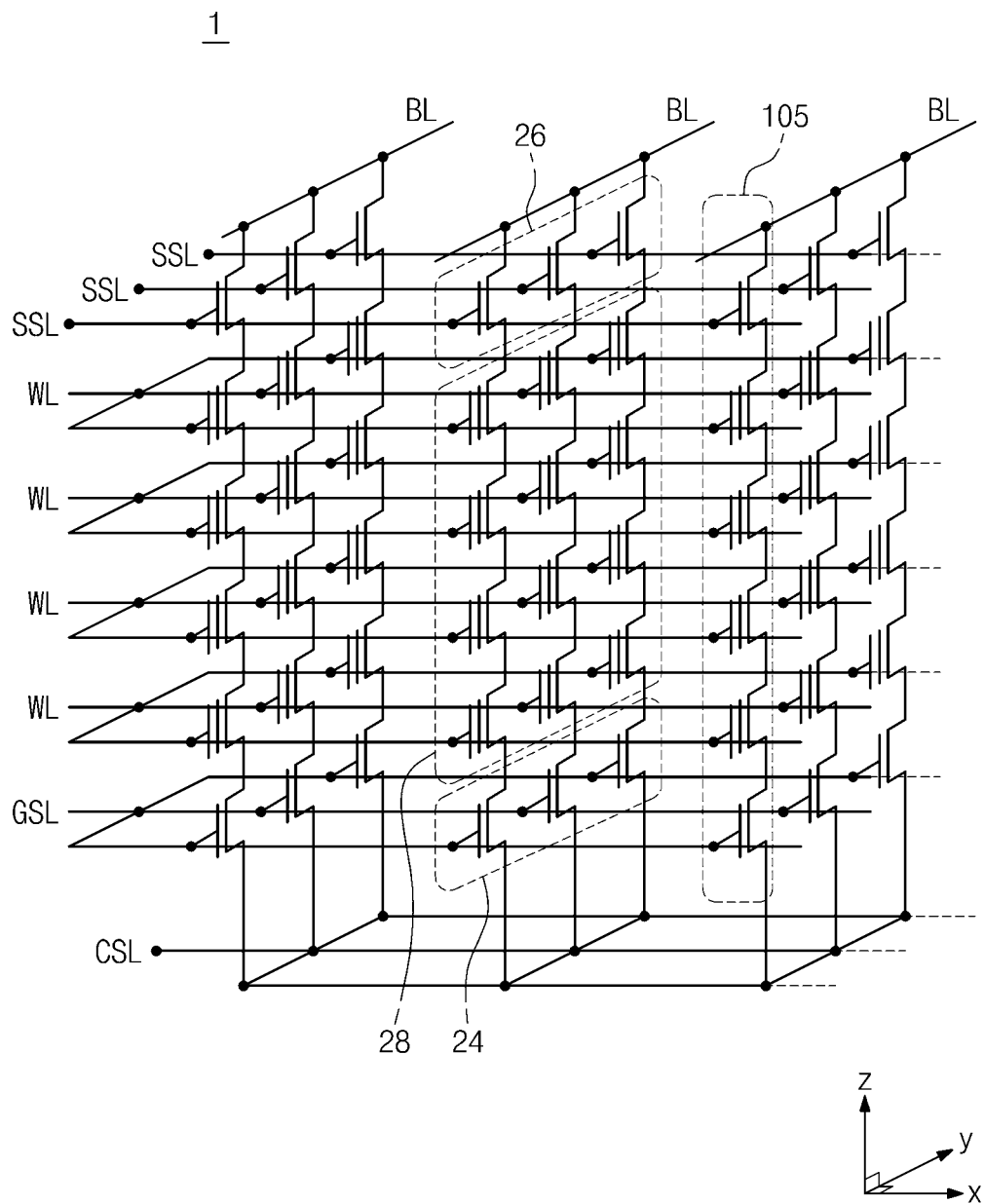
FIG. 1C illustrates a circuit diagram of a semiconductor device, according to an exemplary embodiment.

FIGS. 1A and 1B are perspective views illustrating a semiconductor device according to an exemplary embodiment. FIG. 1C is an equivalent circuit diagram illustrating a semiconductor device according to an exemplary embodiment.

Referring to FIGS. 1A and 1B, a semiconductor memory device 1 may include a plurality of vertical channels 140, a plurality of gates 165 and a plurality of bit lines 145 which are disposed on a substrate 101. The vertical channels 140 may extend in a vertical direction, e.g., the z-axis direction, and may be substantially perpendicular to the substrate 101. The gates 165 may extend in a first horizontal direction, e.g., the x-axis direction. The gates 165 may include, e.g., word lines as referred to "WL" in FIG. 1C and selection lines as referred to "GSL" and "SSL" in FIG. 1C. The GSL may be a ground select line. The SSL may be a string select line. The gates 165 may be stacked along an extending direction, e.g., the z-axis direction, of the vertical channels 140. The bit lines 145 may be electrically connected to the vertical channels 140. The bit lines 145 may extend in a second horizontal direction, e.g., the y-axis direction.

Each of the vertical channels 140 may have a lower portion connected to the substrate 101 and an upper portion connected to one of the bit lines 145. The substrate 101 may include a semiconductor substrate such as a silicon wafer. The gates 165 may include a ground selection gate 165g adjacent to the substrate 101. The gates 165 may include a string selection gate 165s adjacent to the bit lines 145. A plurality of memory gates 165w may be disposed between the ground selection gate 165g and the string selection gate 165s, e.g., along an extending direction of each vertical channel 140. The ground selection gate 165g may constitute a ground selection line, e.g., refer to "GSL" in FIG. 1C. Each of the string selection gates 165s may constitute a string selection line, e.g., refer to "SSL" in FIG. 1C.

Each of the memory gates 165w may constitute a word line, e.g., refer to "WL" in FIG. 1C. A predetermined one of the plurality of vertical channels 140, as well as the word lines WL and the selection lines GSL and SSL adjacent to the predetermined vertical channel 140, may constitute a single cell string, e.g., refer to single cell string 105 in FIG. 1C. The word lines WL, e.g., all of the word lines WL, may act as main memory gates controlling corresponding memory cells of all of the memory cells. At least one word line WL immediately adjacent to the selection line GSL and/or SSL may act as a dummy memory gate of a dummy cell. As described above, the semiconductor device 1 may correspond to a flash memory device including a plurality of memory cells that are arranged in a three dimensional array.

The semiconductor memory device 1 may include a plurality of contacts 180. The contacts 180 may connect the selection lines GSL and SSL and the word lines WL to driving circuits. The contacts 180 may have a plug shape, e.g., may have a shape like a vertical pillar. At least one of the contacts 180 may have a lower portion electrically connected to one of the gates 165, e.g., may contact one of the memory gates 165w. At least one contact 180 may contact the string selection gate 165s, and at least one contact 180 may contact the ground selection gate 165g. At least one of the contacts 180 may have an upper portion electrically connected to a metal line, e.g., one of metal lines 184 and 194. The metal lines 184 and 194 may be electrically connected to the driving circuits. The metal lines 184 and 194 may extend in a direction that intersects the extending direction of the contacts 180.

In an exemplary embodiment, the contacts 180 may be electrically connected to one of the metal lines 184 and 194 through pads 181. The metal lines may be first metal lines 194 and second metal lines 184. The first metal lines 194 may electrically connect the string selection lines SSL to a string selection line driving circuit. The second metal lines 184 may electrically connect the ground selection lines GSL and the word lines WL to a ground selection line driving circuit and a word line driving circuit, respectively.

Intermediate metal lines 182 and 192 may be disposed between the contacts 180 and the metal lines 184 and 194. The intermediate metal lines may include first intermediate metal lines 192 electrically connected to the first metal lines 194. The intermediate metal lines may include second intermediate metal lines 182 electrically connected to the second metal lines 184. For example, the first intermediate metal lines 192 may be electrically connected to the first metal lines 194 through pads 193, and the second intermediate metal lines 182 may be electrically connected to the second metal lines 184 through pads 183.

According to an exemplary embodiment, one of the ground selection gate 165g and the string selection gate 165s may have a line-shaped configuration, and the other may have a plate-shaped configuration. For example, in the line-shaped configuration the gates may include a plurality of rectangular shaped lines arranged parallel to each other, e.g., the rectangular shaped lines may be spaced apart to form a plurality of gates. In the plate-shaped configuration the plurality of gates may be formed from a single continuous plate. Alternatively, the ground selection gate 165g and the string selection gate 165s may have a line-shaped configuration, e.g., as illustrated in FIG. 1B. The memory gates 165w may have a line-shaped configuration or a plate-shaped configuration. For example, each of the string selection gates 165s may have a line-shaped configuration, and each of the memory gates 165w and the ground selection gate 165g may have a rectangular-shaped plate configuration that includes word line slots 132 therein. The word line slots 132 may also be referred to as word line cuts 132 in specification.

The gates 165 may be stacked to have a pyramid structure. That is, each of the gates 165 may have an edge, e.g., a pad 167, that does not overlap with another gate 165 immediately stacked thereon. For example a periphery of the lowest gate 165 may not overlap a peripheral edge of the gate 165 above the lowest gate 165. The uppermost gate 165 may have the smallest perimeter such that the perimeters of the gates 165 gradually decrease from the lowest gate 165 to the uppermost gate 165. The pads 167 of the gates 165 may be exposed when viewed from a top plan view, e.g., as illustrated in FIG. 1B. The pads 167 of the gates 165 may provide areas to which corresponding contacts 180 are connected.

Without intending to be bound by this theory, a parasitic capacitor may exist between the pair of adjacent gates 165 that are arranged such that pairs of adjacent gates 165 overlap, e.g., completely overlap, with each other. In this regard, the more a distance between the adjacent gates 165 is reduced, the more a parasitic capacitance of the parasitic capacitor may be increased. The increase of the parasitic capacitance may lead to, e.g., an increase of an RC delay time that influences an operating speed of the semiconductor memory device 1.

The gates 165 may be electrically isolated, e.g., from adjacent gates 165, by filling spaces between the gates 165 with an insulator such as a silicon oxide layer. For example, the silicon oxide layer may have a dielectric constant of about 3.9. In the event that the dielectric constant of the insulator between the gates 165 decreases, a transmission speed of electrical signals may be improved. Thus, the spaces between the gates 165 may be filled with an insulator having a lower dielectric constant than the silicon oxide layer in order to, e.g., improve the operating speed of the semiconductor memory device 1. In an embodiment, the spaces between the gates 165 may be filled with air or vacuum having a dielectric constant of about 1.0. That is, the gates 165 may be spaced apart from each other to provide air gaps 116 between the gates 165. As a result, the parasitic capacitance and/or loading capacitance between the gates 165 may be reduced, e.g., significantly reduced.

Referring to FIGS. 1A, 1B, and 1C, memory cells 28 may be defined at intersections of the memory gates 165w, e.g., constituting the word lines WL, and the vertical channels 140. Upper non-memory cells 26 may be defined at intersections of the string selection gates 165s, e.g., constituting the string selection lines SSL, and the vertical channels 140. Lower non-memory cells 24 may be defined at intersections of the ground selection gates 165g, e.g., constituting the ground selection line GSL, and the vertical channels 140.

Source regions may be disposed in the semiconductor substrate 101, e.g., the source regions may constitute a common source line CSL as illustrated in FIG. 1C. One upper non-memory cell 26, one lower non-memory cell 24, and the memory cells 28 between the one upper non-memory cell 26 and the one lower non-memory cell 24 may constitute a cell string 105. The memory device 1 may include a plurality of cell strings 105, and each cell string 105 may be disposed along each of the vertical channels 140. Each of the cell strings 105 may be electrically connected to one of the bit lines BL. Each of the bit lines BL may be electrically connected to more than one cell string 105, e.g., to a plurality of cell strings 105 arranged adjacent to each other along a first direction. That is, the plurality of cell strings 105 may be connected in parallel to one of the bit lines BL. The equivalent circuit diagram of FIG. 1C may be applicable to all of the semiconductor memory devices disclosed throughout the specification.

According to an exemplary embodiment, each of the word lines WL may have a planar structure and may be substantially perpendicular to the cell strings 105. The word lines WL may be stacked in, e.g., a z-direction. The memory cells 28 may be arranged in a two dimensional array in each of the word lines WL. The word lines WL may be arranged in an x-y plane such that the word lines may be parallel to each other in x-y planes, e.g., the word lines WL may be stacking in parallel x-y planes. As a result, the memory cells 28 may be arranged in a three dimensional array with the plurality of planar word lines WL which are sequentially stacked. The string selection lines SSL may be disposed to cross the bit lines BL and to extend in the X-axis direction. The string selection lines SSL cross the bit lines BL, and the string selection lines SSL are respectively connected to the cell strings 105. Thus, if one of the string selection lines SSL and one of the bit lines BL are selected, one of the cell strings 105 may be independently selected. The ground selection line GSL may have a planar structure and may be substantially perpendicular to the cell strings 105. The ground selection line GSL may control the electrical connection between the substrate 101 and the vertical channels 140. That is, the ground selection line GSL may control the electrical connection between the substrate 101 and the cell strings 105.

Figure 2A:
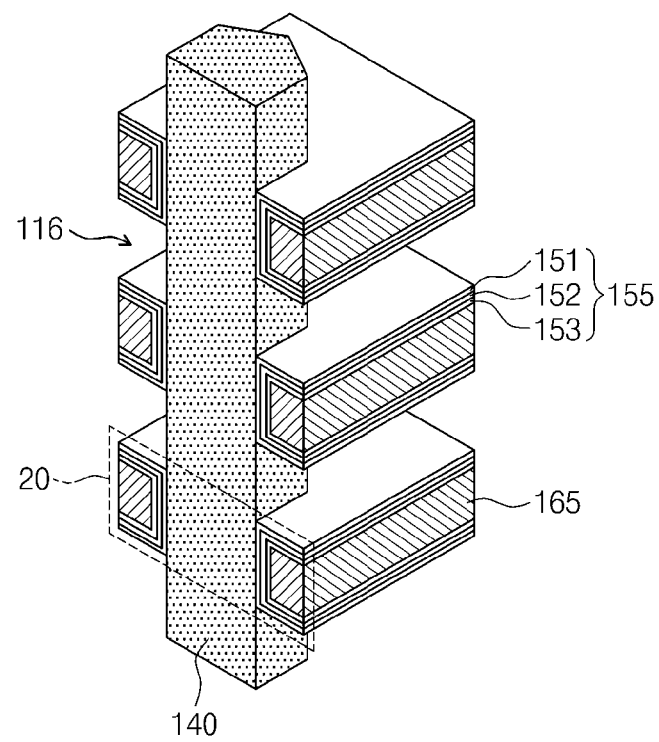
FIGS. 2A to 2F illustrate enlarged perspective views of portions of FIG. 1A, according to exemplary embodiments.

In an embodiment, a program operation of the semiconductor memory device 1 may be achieved by, e.g., inducing a voltage difference between a selected word line WL and a selected vertical channel 140 to inject electrical charges into data storage layer, e.g., data storage layer to 155 of FIG. 2A. For example, if a positive program voltage is applied to the selected word line WL, electrons in the selected vertical channel 140 may be injected into the data storage layer of a selected memory cell disposed at the intersection of the selected word line WL and the selected vertical channel 140 by, e.g., the Fowler-Nordheim tunneling effect. As a result, the program operation may be successively realized. A boosting technique may be applied to non-selected memory cells connected to the selected word line WL to reduce the possibility of and/or prevent the non-selected memory cells from being programmed during the program operation. The explanations of the data storage layer will be described with reference to FIGS. 2A to 2F.

A read operation may include, e.g., applying a ground voltage to a selected word line WL connected to a selected memory cell 28 to be read out and applying a read voltage to non-selected word lines WL. The read voltage may be determined to turn on the memory cells connected to the non-selected word lines WL. For example, a current flowing through a bit line BL connected to a selected cell string 105 including the selected memory cell 28 may be decided depending on whether a threshold voltage of the selected memory cell 28 is higher or lower than the ground voltage. For example, if the threshold voltage of the selected memory cell 28 is lower than the ground voltage, the current flowing through the bit line connected to the selected cell string 105 may be charged up. Otherwise, the bit line current may not be charged up. Accordingly, data information stored in the selected memory cell 28 may be discriminated by detecting the bit line current of the selected memory cell 28.

An erase operation may be performed, e.g., using a gate induced drain leakage (GIDL) current by the memory block. In an embodiment, an electrical potential of a selected vertical channel 140 may be boosted by applying an erasure voltage to a selected bit line BL and the substrate 101. The erasure voltage may be, e.g., a positive voltage. The potential of the selected vertical channel 140 may rise up after a predetermined delay time. When a low voltage, e.g., a ground voltage, is applied to the ground selection gate 165g corresponding to the ground selection line, the gate induced drain leakage (GIDL) effect may occur at a junction region between a source region adjacent to the ground selection gate 165g and the selected vertical channel 140. Thus, electrons generated at the junction region may be injected into the substrate 101, and holes generated at the junction region may be injected into the selected vertical channel 140. As a result, an electrical potential corresponding to the erasure voltage may be transmitted to the selected vertical channel 140. In this case, if a ground voltage is applied to the word lines WL adjacent to the selected vertical channel 140, electrons in the data storage layers of the memory cells formed at the selected vertical channel 140 may be ejected. Thus, all of the memory cells formed at the selected vertical channel 140 may be simultaneously erased. Non-selected memory cells in non-selected memory blocks may not be erased by electrically floating the word lines connected to the non-selected memory blocks during the erase operation.

The operation methods described above correspond to exemplary embodiments. That is, the operation methods may be embodied in different forms and should not be construed as limited to the embodiments set forth herein.

Examples of the Data Storage Layer

FIGS. 2A to 2F are enlarged perspective views illustrating a portion of FIG. 1A.

Referring to FIG. 2A, a data storage layer 155 may surrounds each of the gates 165. The data storage layer 155 may include, e.g., a tunneling insulation layer 151, a blocking insulation layer 153, and a trapping insulation layer 152 between the tunnel insulation layer 151 and the blocking insulation layer 153. The blocking insulation layer 153, the trapping insulation layer 152, and the tunneling insulation layer 151 may be sequentially stacked. The tunneling insulation layer 151 may contact the vertical channel 140 and may extend to cover top and bottom surfaces of the respective gates 165. The blocking insulation layer 153 may contact a sidewall, a top surface, and a bottom surface of the respective gates 165.

The tunneling insulation layer 151 may include, e.g., at least one of a silicon oxide layer and a silicon nitride layer. The trapping insulation layer 152 may include, e.g., a silicon nitride layer. The blocking insulation layer 153 may include, e.g., at least one of a silicon oxide layer and an aluminum oxide layer. In another exemplary embodiment, the trapping insulation layer 152 may be replaced with a floating gate.

Each of the gates 165 may surrounds the vertical channel 140, and the data storage layer 155 may be disposed between the gate 165 and the vertical channel 140. The gate 165 and the vertical channel 140 surrounded by the gate 165 may constitute a cell 20. The cell 20 may correspond to a memory cell, e.g., when the gate 165 is a memory gate 165w, as illustrate in FIG. 1A. Alternatively, the cell 20 may correspond to a non-memory cell when the gate 165 is a selection gate 165g or 165s, as illustrate in FIG. 1A. A structure of the data storage layer 155 may be modified in various forms, as described with reference to FIGS. 2B to 2F.

Figure 2B:
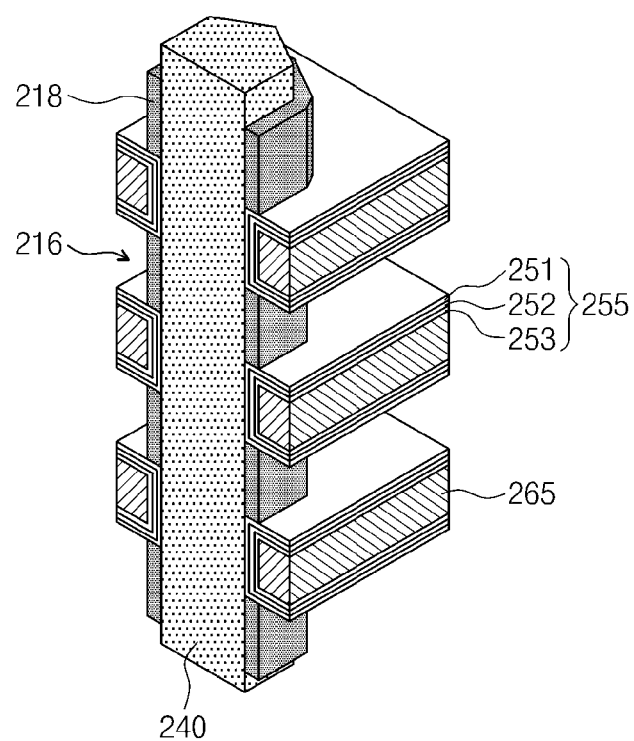

Referring to FIG. 2B, a protection layer 218 may be disposed between data storage layers 255 and surrounding gates 265. The protection layer 218 may surround sidewalls of a vertical channel 240, which are exposed by air gaps 216, e.g., are exposed in areas between adjacent surrounding gates 265.

Thus, the protection layer 218 may reduce the possibility of and/or prevent the sidewalls of the vertical channel 240 from being damaged by, e.g., an etching process. This will be clearly understood from FIG. 6E.

Figure 2C:
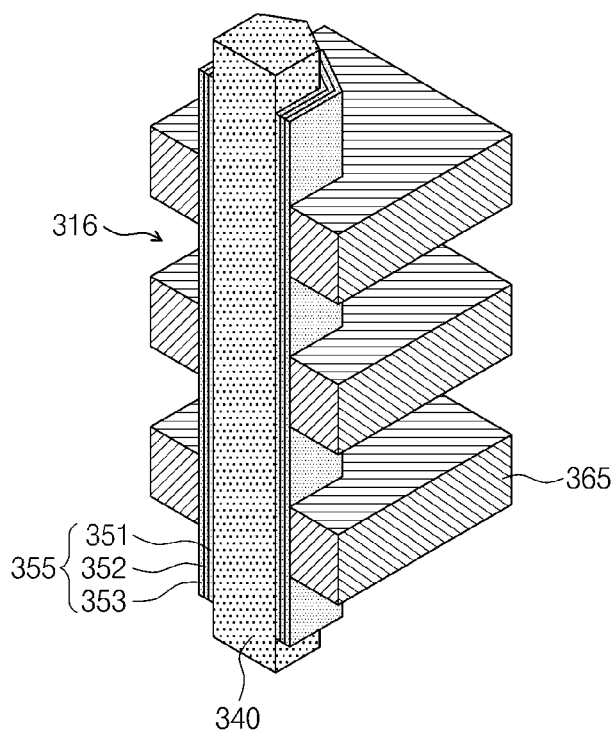

Referring to FIG. 2C, a data storage layer 355 may surround sidewalls of a vertical channel 340. The data storage layer 355 may be are located between gates 365 and the vertical channel 340. The data storage layer 355 may vertically extend to intervene between the vertical channel 340 and the gates 365. In an exemplary embodiment, the data storage layer 355 may include a tunneling insulation layer 351, a blocking insulation layer 353, and a trapping insulation layer 352 between the tunnel insulation layer 351 and the blocking insulation layer 353. The tunneling insulation layer 351 may contact the vertical channel 340 and may vertically extend to cover substantially entire sidewalls of the vertical channel 340, e.g., to entirely cover sides of the vertical channel 340 in an area having the gates 365. The blocking insulation layer 353 may contact the gates 365 and may vertically extend, e.g., to substantially cover the entire tunneling insulation layer 351.

The data storage layer 355 may be absent in the spaces 316, e.g., air gaps, between the gates 365. For example, the data storage layer 355 may not extend horizontally to cover top and bottom surfaces of the respective gates 365. Thus, distances between the gates 365 may be minimized to lower an overall height of the semiconductor memory device.

Figure 2D:
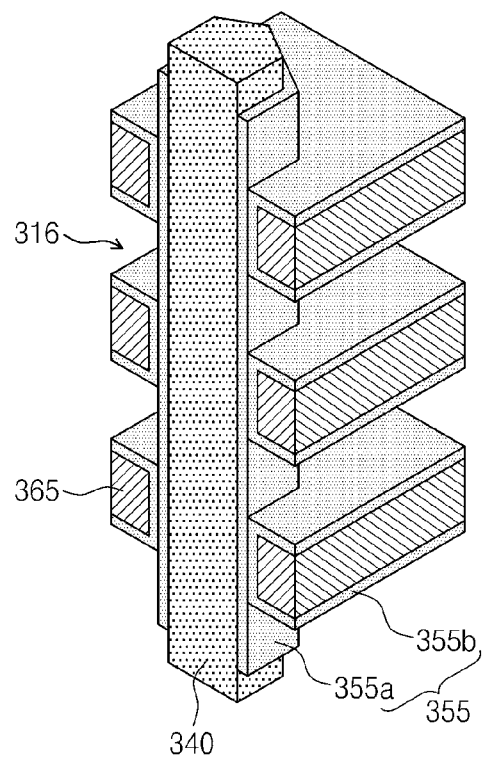

Referring to FIG. 2D, the data storage layer 355 may be disposed between the vertical channel 340 and the gates 365, and the data storage layer 355 may include a first data storage layer 355a and a second data storage layer 355b on the gates 365. The first data storage layer 355a may vertically extend to cover the entire sidewalls of the vertical channel 340, e.g., to entirely cover sidewalls of the vertical channel 340 in an area having the gates 365. The second data storage layer 355b may horizontally extend to cover a top surface and a bottom surface of each of the gates 365. The first data storage layer 355a may include, e.g., a tunneling insulation layer. The second data storage layer 355b may include, e.g., a blocking insulation layer. One of the first and second data storage layers 355a and 355b may include a trapping insulation layer.

Figure 2E:
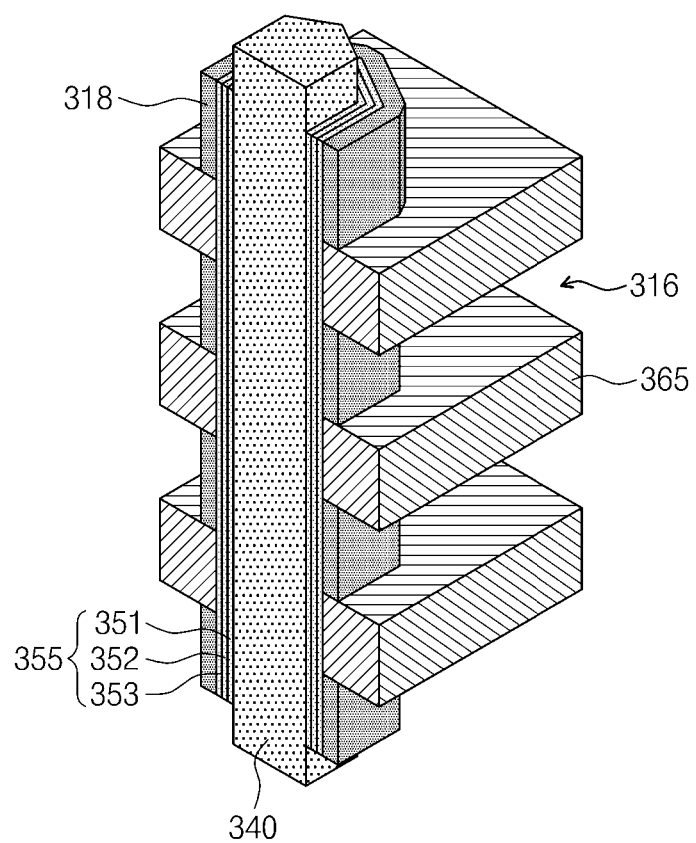

Referring to FIG. 2E, the data storage layer 355 may have substantially the same configuration and structure as described with reference to FIG. 2C. In addition, a protection layer 318 may be disposed to cover outer sidewalls of the data storage layer 355 between the gates 365. That is, the protection layer 318 may cover the outer sidewalls of the data storage layer 355, which are exposed by the air gaps 316 between the gates 365. The protection layer 318 may reduce the possibility of and/or prevent the vertical channel 340 and the data storage layer 355 from being damaged by an etching process.

Figure 2F:
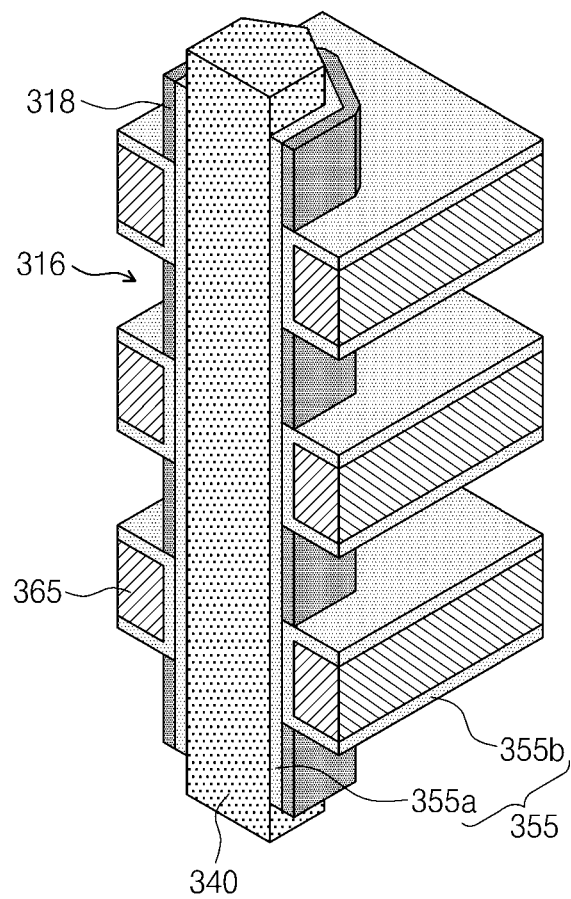

Referring to FIG. 2F, the data storage layer 355 may have substantially the same configuration and structure as described with reference to FIG. 2D. In addition, the protection layer 318 illustrated in FIG. 2E may be disposed to cover outer sidewalls of the first data storage layer 355a between the gates 365. That is, the protection layer 318 may cover the outer sidewalls of the first data storage layer 355a, which are exposed by the air gaps 316 between the gates 365. The protection layer 318 may reduce the possibility of and/or prevent the vertical channel 340 and the first data storage layer 355a from being damaged by an etching process.

First Exemplary Method Embodiment

FIGS. 3A to 3J are vertical sectional views taken along a parallel direction to a bit line to illustrate stages in an exemplary method of fabricating a semiconductor device. FIGS. 4A, 4B, and 4C are vertical sectional views taken along a direction crossing bit lines in FIGS. 3C, 3H and 3J, respectively, to illustrate stages in an exemplary method of fabricating a semiconductor device.

Figure 3A:
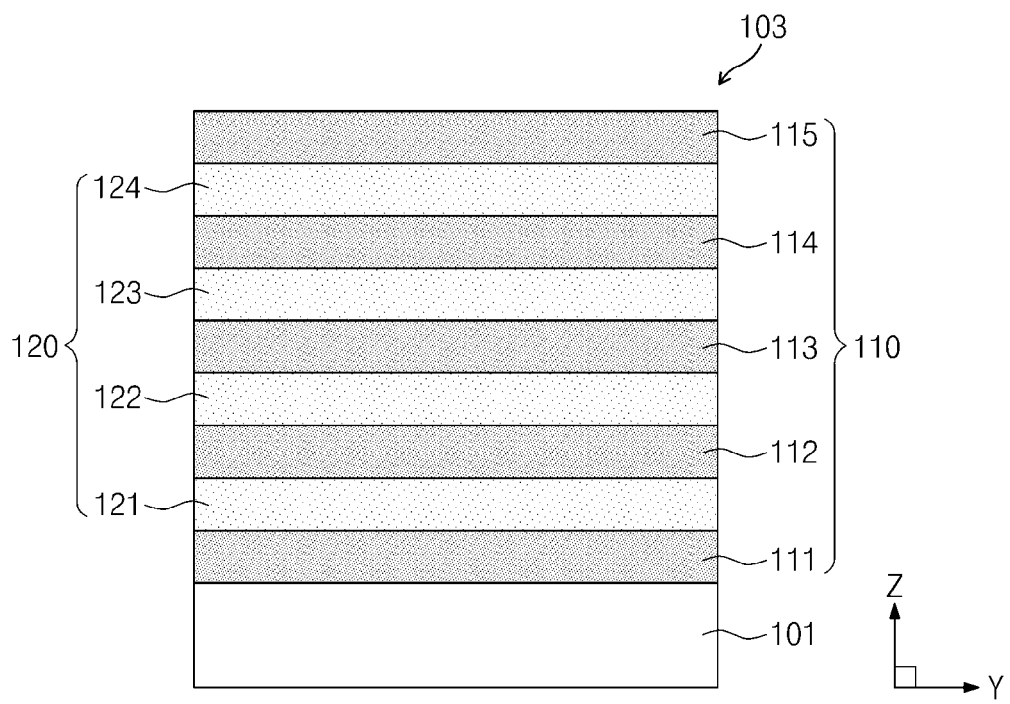
FIGS. 3A to 3J illustrate vertical sectional views, taken along a direction parallel to a bit line, of stages in a method of fabricating a semiconductor device, according to an exemplary embodiment.
Figure 4A:
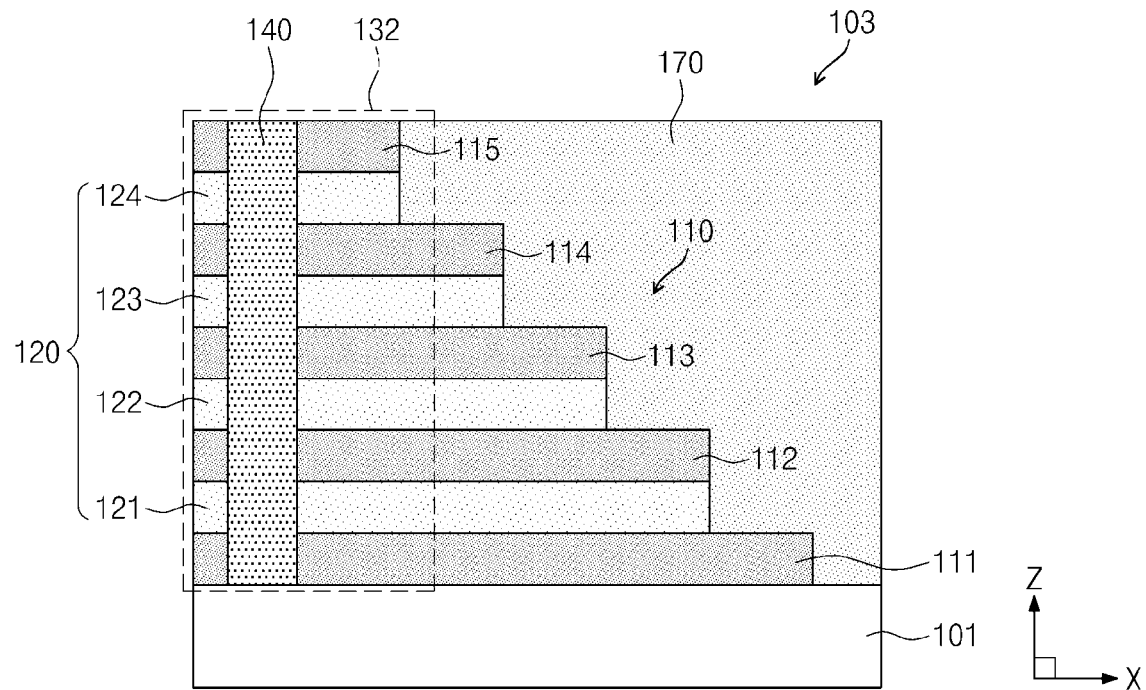
FIGS. 4A to 4C illustrate vertical sectional views, taken along a direction crossing bit lines in FIGS. 3C, 3H and 3J, respectively, of stages in a method of fabricating a semiconductor device, according to an exemplary embodiment.
Figure 4B:
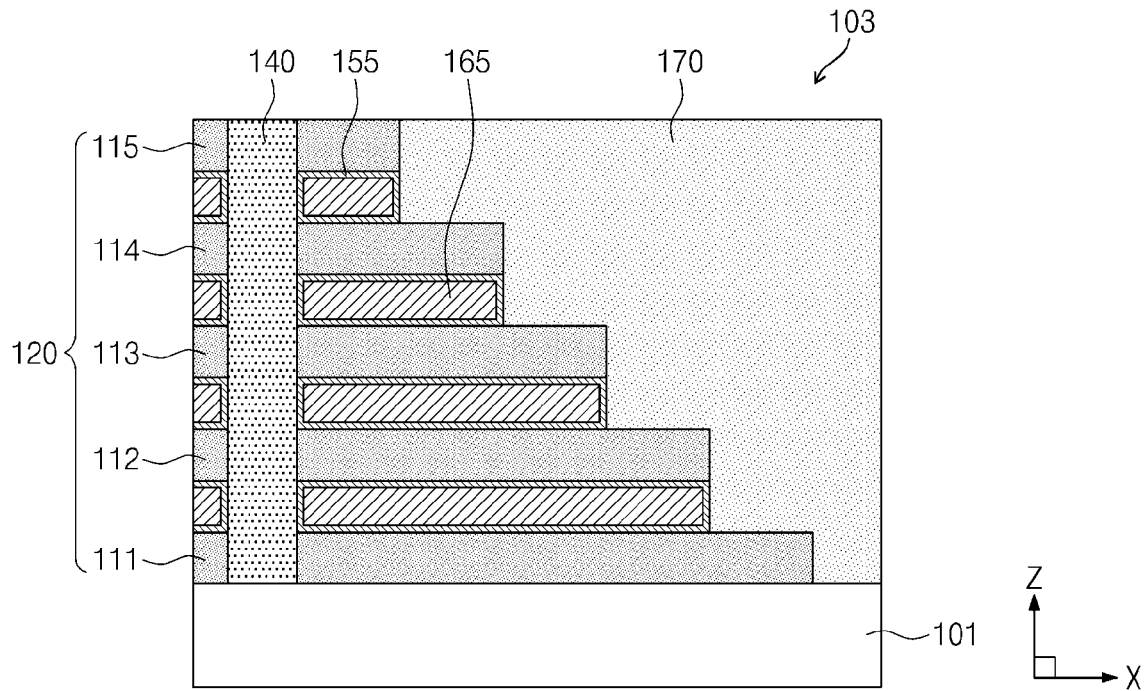
Figure 4C:
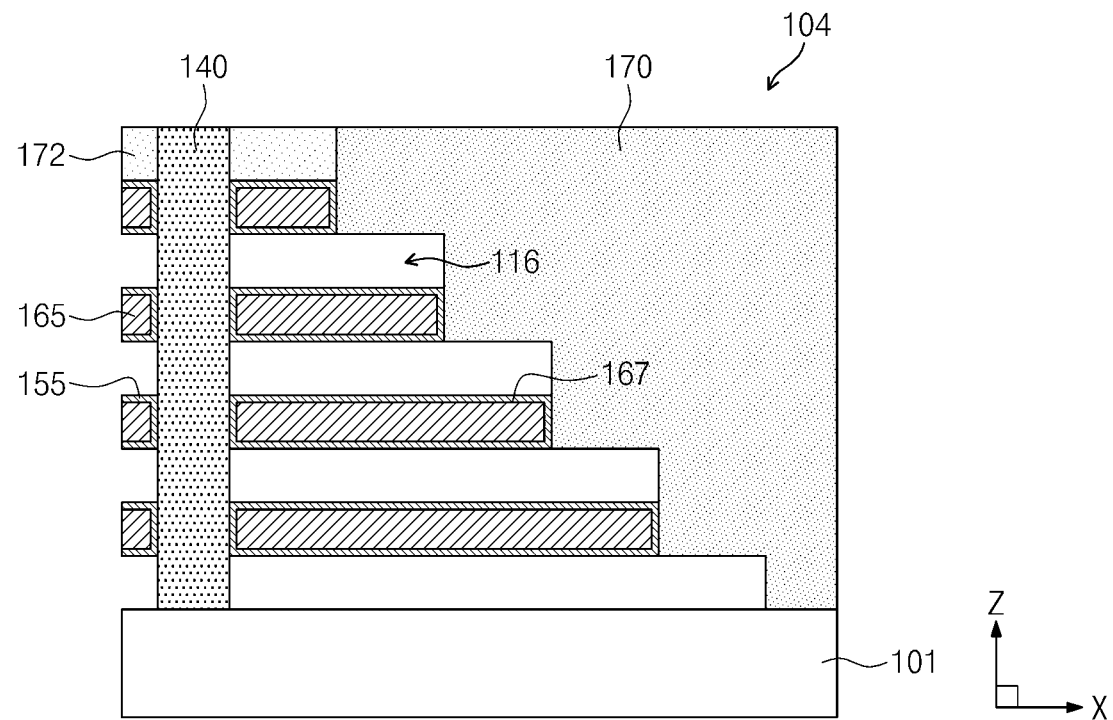

Referring to FIG. 3A, first sacrificial layers 111-115 and second sacrificial layers 121-124 may be alternately deposited on a substrate 101 to form a mold stack 103. However, embodiments are not limited thereto, e.g., the mold stack may include additional first and second sacrificial layers. The substrate 101 may include a semiconductor substrate such as a silicon wafer or a substrate having an insulation layer. The mold stack 103 may include a first sacrificial layer group 110 and a second sacrificial layer group 120. The first sacrificial layer group 110 may be composed of the first sacrificial layers 111, 112, 113, 114 and 115. The second sacrificial layer group 120 may be composed of the second sacrificial layers 121, 122, 123 and 124.

In an embodiment, a bottommost layer and a topmost layer of the mold stack 103 may be the first sacrificial layer 111 and the first sacrificial layer 115, respectively. The number of the first sacrificial layers 111-115 may be optional, and the number of the second sacrificial layers 121-124 may also be optional. In the following embodiment, the number of the first sacrificial layers 111-115 is 5 and the number of the second sacrificial layers 121-124 is 4, as illustrated in FIG. 3A. However, embodiments are not limited to the following exemplary embodiment, and may be implemented in various forms.

The first sacrificial layers 111-115 may be formed of a material layer having a relatively high wet etching selectivity with respect to the second sacrificial layers 121-124 to selectively remove one of the first sacrificial layer group 110 and the second sacrificial layer group 120, as subsequently described with reference to FIGS. 3D and 3I. The first sacrificial layers 111-115 may be composed of a material layer having a relatively low dry etching selectivity or no dry etching selectivity with respect to the second sacrificial layers 121-124 in order to form vertical channel holes 130 and word line cuts 132 with a simple etching recipe, as subsequently described with reference to FIGS. 3B and 3C. For example, each of the first sacrificial layers 111-115 may be formed by depositing at least one of a silicon oxide ($SiO_2$) layer, a silicon nitride (SiN or $Si_3N_4$) layer, a silicon oxynitride (SiON) layer, a silicon carbide (SiC) layer, and a silicon-germanium (SiGe) layer. The second sacrificial layers 121-124 may be formed by depositing at least one of a silicon oxide ($SiO_2$) layer, a silicon nitride (SiN) layer, a silicon oxynitride (SiON) layer, a silicon carbide (SiC) layer, and a silicon-germanium (SiGe) layer, but the second sacrificial layers 121-124 may be formed of a different layer than that used to form the first sacrificial layer 111-115. In an embodiment, the first sacrificial layers 111-115 may be formed of a silicon germanium (SiGe) layer, and the second sacrificial layers 121-124 may be formed of a silicon nitride (SiN or $Si_3N_4$) layer or a silicon oxynitride (SiON) layer.

Figure 3B:
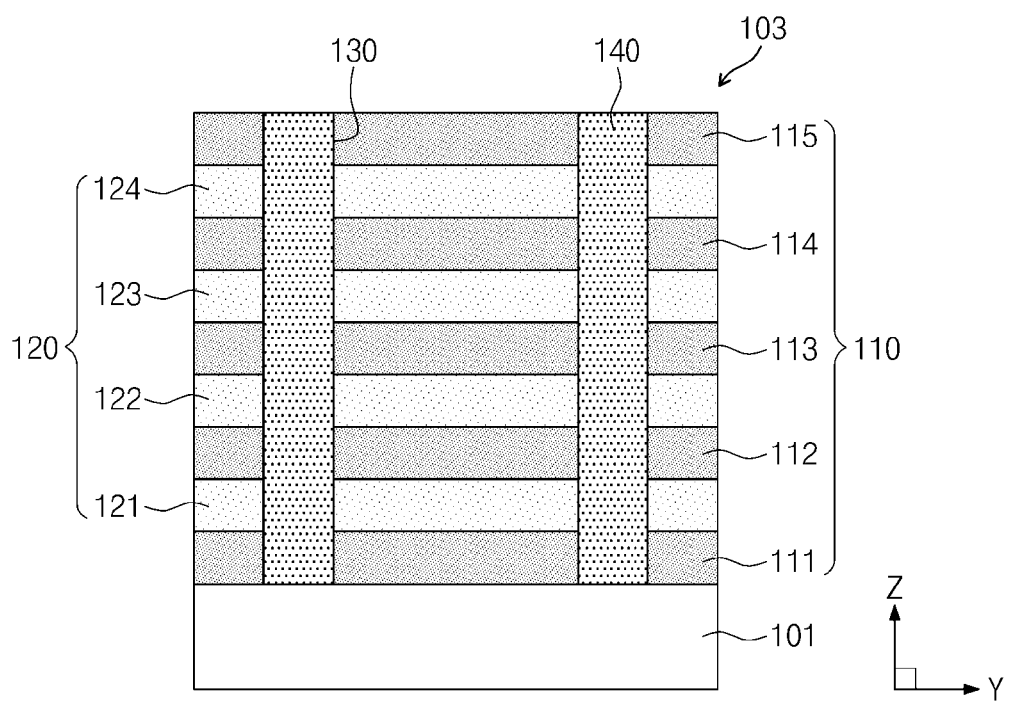

Referring to FIG. 3B, a plurality of vertical channels 140 may be formed to penetrate the mold stack 103. The vertical channels 140 may be in contact with the substrate 101. According to an exemplary embodiment, a plurality of vertical channel holes 130 penetrating the first and second sacrificial layer groups 110 and 120 may be formed using a dry etching technique or a laser drilling technique. The vertical channels 140 may be formed by filling the vertical channel holes 130 with, e.g., a semiconductor material.

The vertical channels 140 may be formed of at least one of a polysilicon layer, a single crystalline silicon layer, and an amorphous silicon layer. The vertical channels 140 may be formed by using a physical vapor deposition (PVD) technique, a chemical vapor deposition (CVD) technique, or an epitaxial growth technique. Each of the vertical channels 140 may be formed to have a bulk configuration such as a pillar having a circle-shaped horizontal sectional view or a pillar having a polygon-shaped horizontal sectional view. Alternatively, each of the vertical channels 140 may be formed to include a macaroni-shaped silicon structure and a bar-shaped insulator filling an inner space of the macaroni-shaped silicon structure.

Figure 3C:
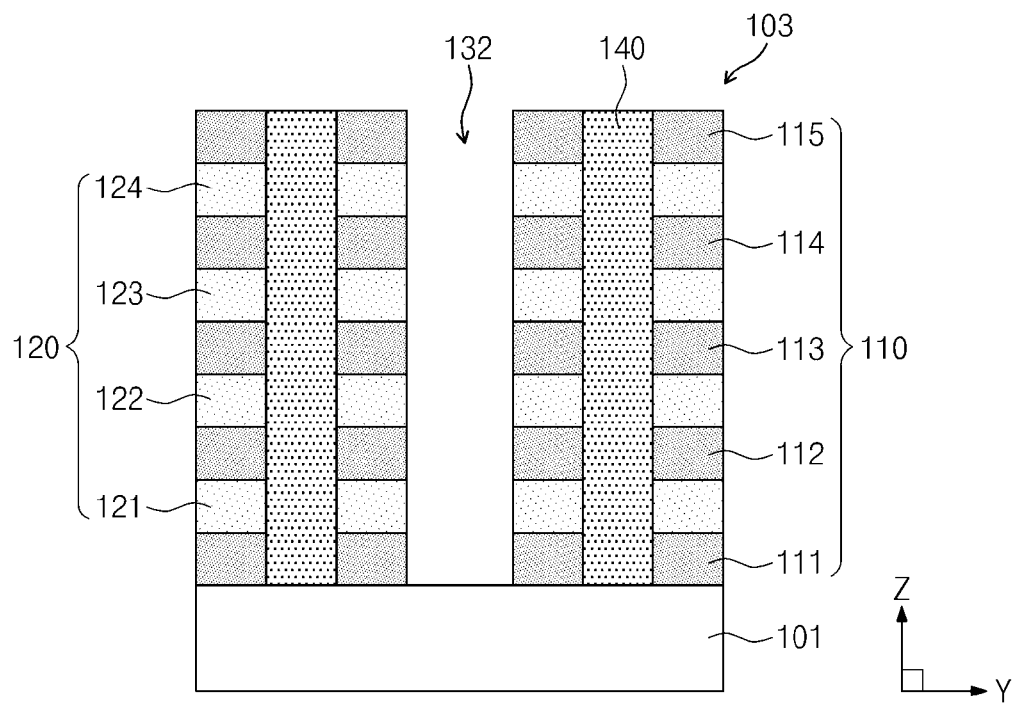

Referring to FIG. 3C, the mold stack 103 may be patterned to form word line cuts 132. An area of the first sacrificial layers 111-115 and the second sacrificial layers 121-124 between the vertical channels 140 may be removed using a dry etching technique to form the word line cuts 132. The word line cuts 132 may expose the substrate 101 or the bottommost first sacrificial layer 111. The word line cuts 132 may expose sidewalls of the first and second sacrificial layers 111-115 and 121-124. The word line cuts 132 may be formed to have a trench shape extending in the x-axis, e.g., extending in the same direction as the word line 165 was illustrated in FIG. 1B.

Before or after formation of the word line cuts 132, the mold stack 103 may be patterned to have a step shape at edges thereof, e.g., as illustrated in FIG. 4A. That is, the mold stack 103 may be patterned to have a pyramid structure, before or after formation of the word line cuts 132. For example, the mold stack 103 may be patterned using an exposure process for shrink or expansion of a photo mask and a dry etching process, thereby forming a mold stack 103 having stepped edges. That is, the stepped mold stack 103 may be formed so that the length of the first and second sacrificial layers 111-115 and 121-124 in the x-axis direction or in x-axis and y-axis directions is gradually reduced for first and second sacrificial layers 111-115 and 121-124 positioned further away from the substrate 101. For example, the topmost first sacrificial layer 115 and the topmost second sacrificial layer 124 may be patterned to form a first step, and the first sacrificial layer 114 and the second sacrificial layer 123 under the first step may be patterned to form a second step.

After formation of the mold stack 103 having the stepped edge, an insulation layer 170 may be additionally formed on the substrate 101 having the stepped mold stack 103. The insulation layer 170 may be formed of, e.g., a silicon oxide layer. The word line cuts 132 may be formed before or after formation of the insulation layer 170. The word line cuts 132 may have a length in the x-axis direction which is greater than a length in the X-axis direction of the patterned topmost first sacrificial layer 115 and is less than a length in the x-axis direction of the patterned first sacrificial layer 114 under the patterned topmost first sacrificial layer 115 (see FIG. 4A). As a result, each of the topmost first sacrificial layer 115 and the topmost second sacrificial layer 124 may be divided into a plurality of sub-patterns, which are separated from each other, by the word line cuts 132. The sub-patterns may be arrayed in the y-axis direction because the word line cuts 132 may be formed to extend in the x-axis direction. According to another embodiment, each of the first sacrificial layers 111-114 and the second sacrificial layers 121-123 may be formed to have a plate shape with the word line cuts 132 therein.

Figure 3D:
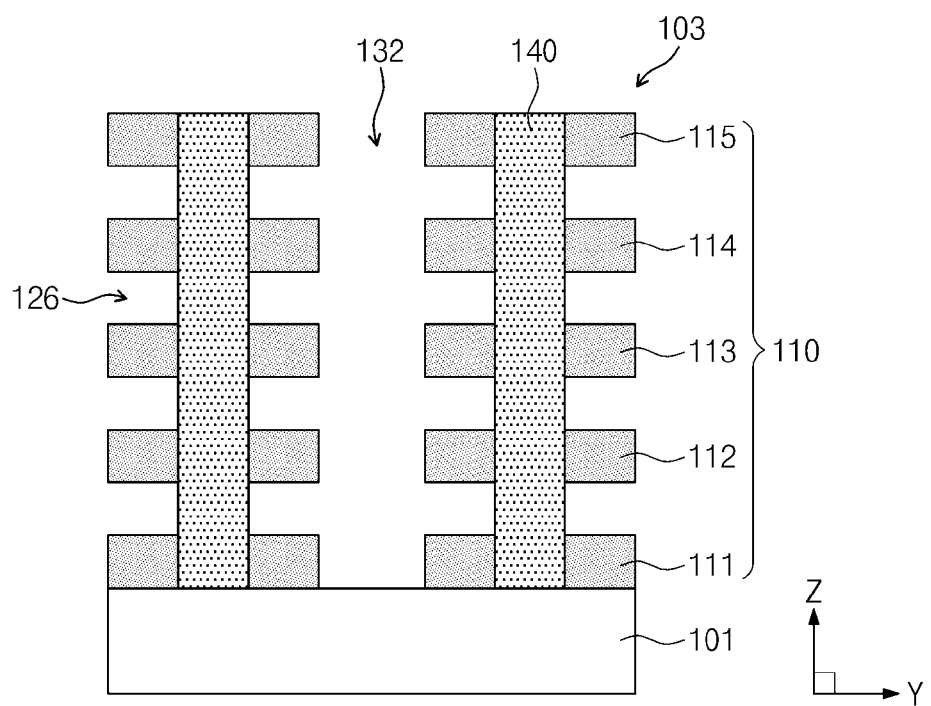

Referring to FIG. 3D, the second sacrificial layer group 120 may be selectively removed to form a plurality of recessed regions 126, e.g., a plurality of undercuts between the first sacrificial layers 111-114 of the first sacrificial group 110. In an exemplary embodiment, when the second sacrificial layers 121-124 are formed of a silicon nitride layer, the second sacrificial layers 121-124 may be removed by supplying a wet etchant such as a phosphoric acid ($H_3PO_4$) solution through the word line cuts 132. As a result, the first sacrificial layers 111-115 may exist to be vertically spaced apart from each other along the vertical channels 140, and sidewalls of the vertical channels 140 may be exposed by the recessed regions 126.

Figure 3E:
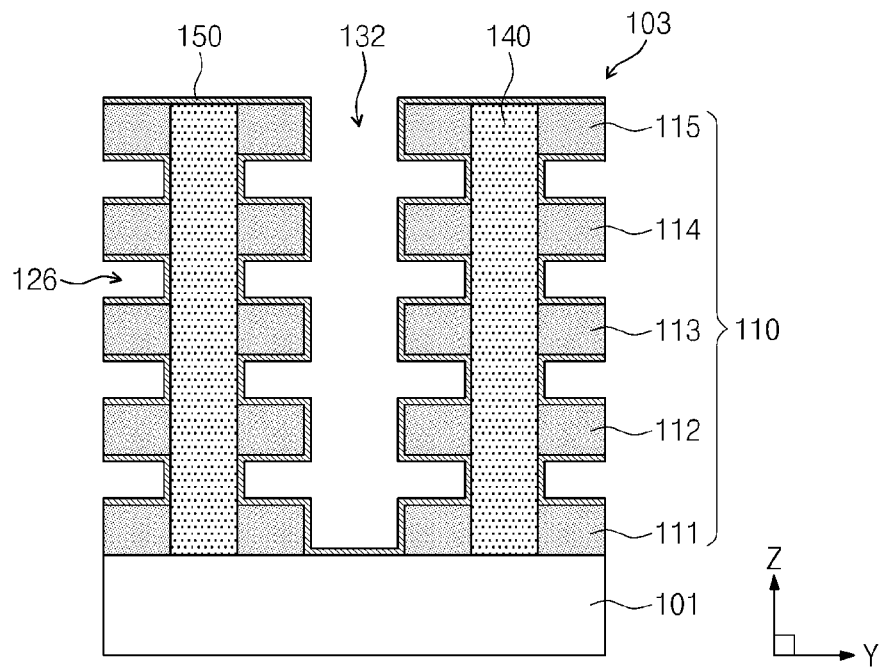

Referring to FIG. 3E, an insulation layer stack 150 may be formed on the substrate 101 having the mold stack 103 and the recessed regions 126. The insulation layer stack 150 may be formed using a technique, e.g., a chemical vapor deposition (CVD) technique or an atomic layer deposition (ALD) technique, which exhibits an excellent step coverage characteristic. Thus, the insulation layer stack 150 may be formed to conformably cover insides of the recessed regions 126. The insulation layer stack 150 may be formed to have a multi-layered structure, as illustrated in FIG. 2A. For example, the insulation layer stack 150 may be formed to include a tunneling insulation layer 151, a trapping insulation layer 152, and a blocking insulation layer 153. The tunneling insulation layer 151 may be formed by depositing, e.g., a silicon oxide layer, and trapping insulation layer 152 may be formed by depositing, e.g., a silicon nitride layer on the tunneling insulation layer 151. The blocking insulation layer 153 may be formed by depositing, e.g., a silicon oxide layer or an aluminum oxide layer, on the trapping insulation layer 152. The insulation layer stack 150 may be formed to surround sidewalls of the first sacrificial layers 111-115 and to cover the substrate 101 which is exposed by the word line cuts 132

Figure 3F:
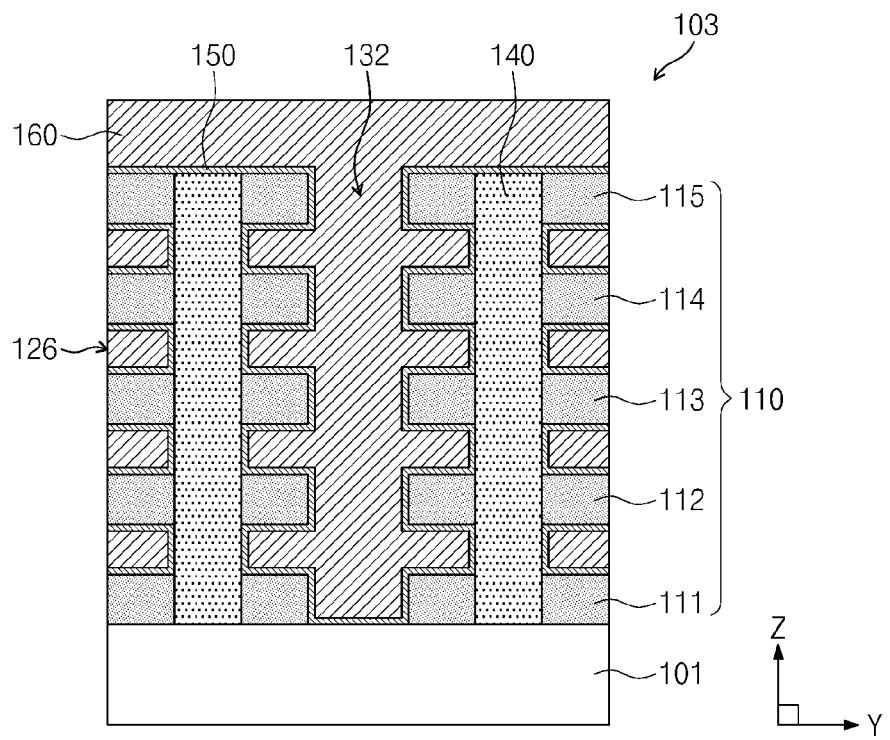

Referring to FIG. 3F, a conductive layer 160 may be formed on the insulation layer stack 150. The conductive layer 160 may be formed to fill the word line cuts 132 and the recessed regions 126. The conductive layer 160 may be formed of, e.g., at least one of a doped silicon layer, a tungsten layer, a metal nitride layer, or a metal silicide layer. The conductive layer 160 may be formed by using a chemical vapor deposition technique. In an embodiment, the conductive layer 160 may be formed of a tungsten layer, a titanium nitride layer, or a combination layer thereof.

Figure 3G:
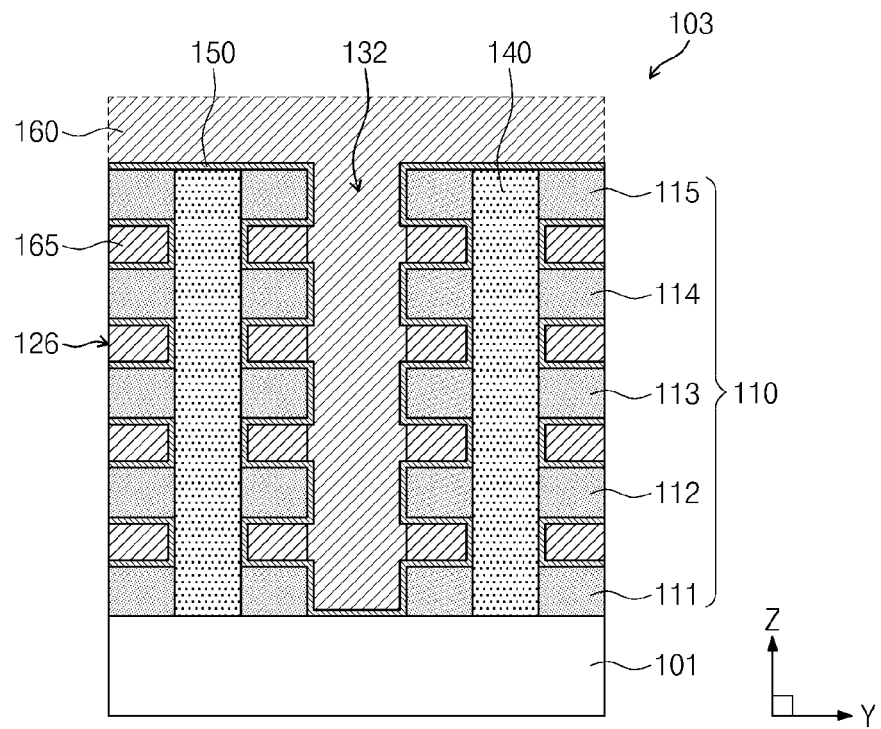

Referring to FIG. 3G, a portion of the conductive layer 160 may be removed to form the gates 165. The gates 165 may be disposed in the recessed regions 126 and may be separated from each other. For example, the conductive layer 160 may be etched using a dry etching technique or a wet etching technique, thereby leaving the conductive layer 160 in the recessed regions 126. As a result, the gates 165 may be formed in the recessed regions 126. The conductive layer 160 may be formed of at least one of various conductive materials. That is, the gates 165 may be formed of at least one of various conductive materials. The insulation layer stack 150 formed outside the recessed regions 126 may be exposed after formation of the gates 165.

Figure 3H:
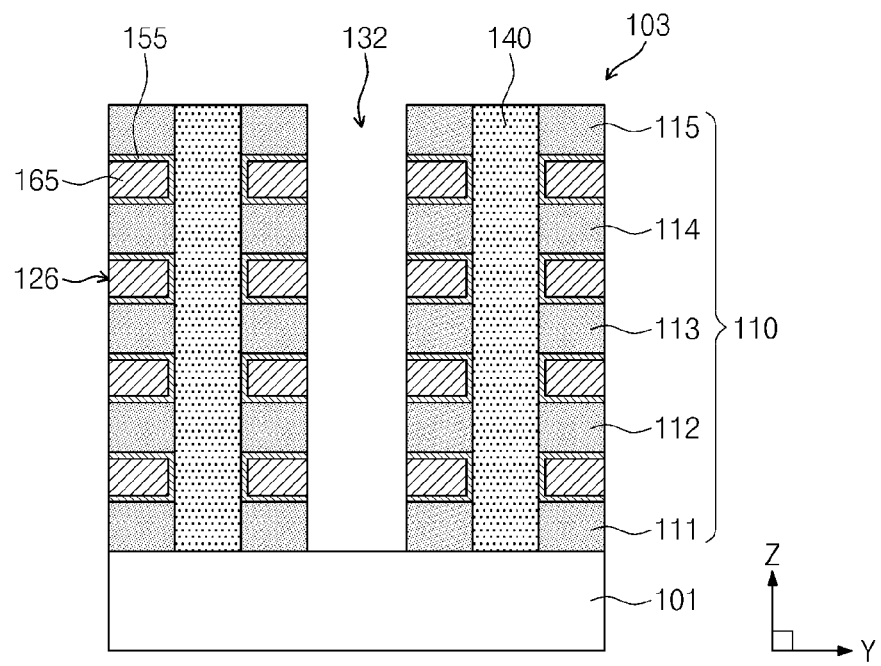

Referring to FIG. 3H, the exposed insulation layer stack 150 may be selectively removed using a dry etching technique or a wet etching technique. Sidewalls of the first sacrificial layers 111-115 may be exposed through the word line cuts 132 after removal of the exposed insulation layer stack 150. As illustrated in FIGS. 4A and 4B, edges of the gates 165 may be formed to have a stepped shape when the mold stack 103 is patterned to have a stepped shape.

Figure 3I:
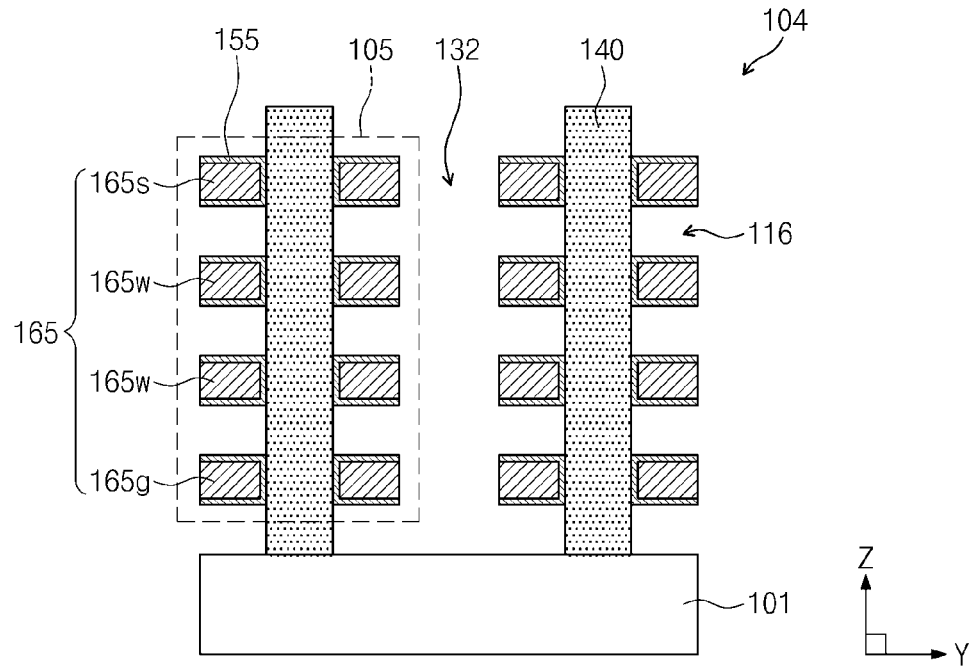

Referring to FIG. 3I, the first sacrificial layers 111-115 may be selectively removed. In an embodiment, when the first sacrificial layers 111-115 are formed of a silicon germanium (SiGe) layer, the first sacrificial layers 111-115 may be selectively removed by supplying a wet etchant such as a hydrofluoric acid (HF) solution or a mixture of a hydrofluoric acid (HF) solution and a nitric acid ($HNO_3$) solution through the word line cuts 132. Thus, air gaps 116 may be formed between the gates 165. As a result, a gate stack 104 may be formed on the substrate 101. The gate stack 104 may include the vertical channels 140 and the gates 165 vertically separated from each other by the air gaps 116 along the respective vertical channels 140. Since the air has a dielectric constant of about 1, the parasitic capacitance between the gates 165 may be minimized.

The gates 165 may include at least one string selection gate 165s, at least one ground selection gate 165g, and a plurality of memory gates 165w. Each of the string selection gate 165s and the ground selection gate 165g may constitute a non-memory transistor together with the corresponding vertical channel 140 and the corresponding data storage layer 155. Each of the memory gates 165w may constitute a memory transistor together with the corresponding vertical channel 140 and the corresponding data storage layer 155. The non-memory transistors and the memory transistors that are vertically stacked along one vertical channel 140, may constitute a single cell string 105. That is, the cell string 105 may include one of the vertical channels 140 and the selection gates 165s and 165g and the memory gates 165w vertically stacked along the vertical channel 140

Figure 3J:
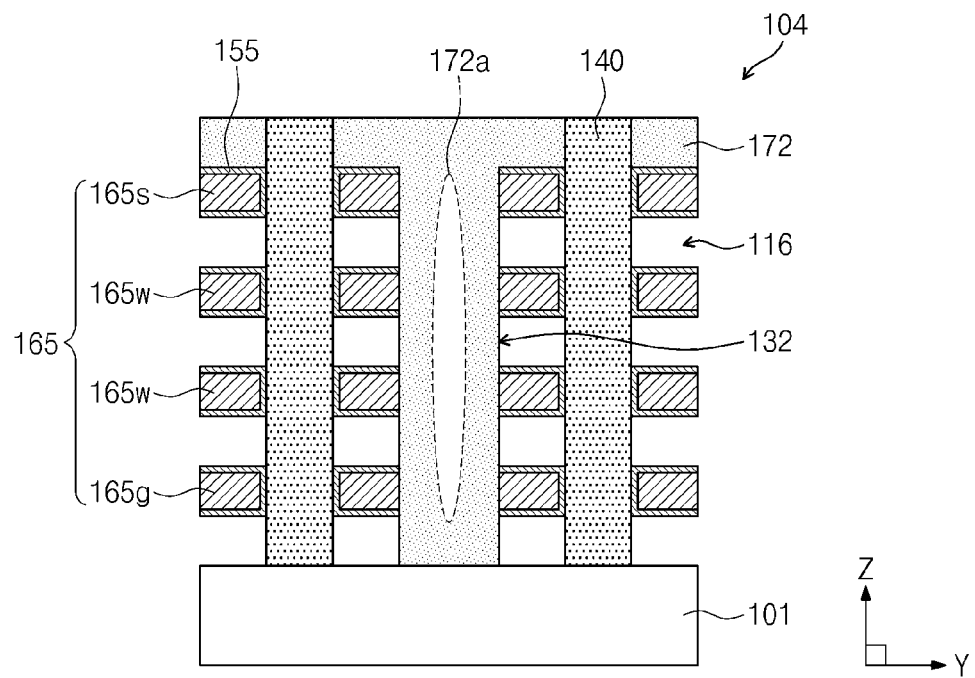

Referring to FIG. 3J, an insulation layer 172 may be formed on the substrate having the air gaps 116. The insulation layer 172 may be formed to fill the word line cuts 132 but not to fill the air gaps 116. In an embodiment, the insulation layer 172 may be formed of, e.g., an oxide layer such as a silicon oxide layer using a chemical vapor deposition (CVD) technique. The insulation layer 172 may be formed to have a void 172a in each of the word line cuts 132. In other words, the insulation layer 172 may exhibit poor step coverage such that the voids, e.g., the voids 172a, are formed therein. The voids 172a may be formed to reach the air gaps 116 adjacent thereto. In the event that the voids 172a are formed, the parasitic capacitance between the gates 165 horizontally adjacent to each other may also be reduced. The insulation layer 172 may close off, e.g., seal the word line cuts 132, and the air gaps 116 adjacent to the word line cuts 132.

The insulation layer 172 may be planarized until the vertical channels 140 are exposed. The planarization of the insulation layer 172 may be performed using, e.g., a chemical mechanical polishing (CMP) process or an etch-back process. Alternatively, the planarization of the insulation layer 172 may be omitted. As illustrated in FIG. 4C, the gates 165 may be formed to have a stepped edge configuration. Thus, the edges of the gates 165 may act as pads 167 that provide areas to be in contact with, e.g., the contacts 180 of FIGS. 1A and 1B.

Subsequently, bit lines 145, e.g., as illustrated in FIG. 1A, and contacts 180, e.g., as illustrated in of FIG. 1A, may be formed to complete the semiconductor memory device 1. The bit lines 145 may be formed to be electrically connected to the vertical channels 140, and the contacts 180 may be formed to be in contact with the pads 167 of the gates 165.

Second Exemplary Method Embodiment

FIGS. 5A to 5F are vertical sectional views illustrating a method of fabricating a semiconductor device according to another exemplary embodiment. This embodiment is similar to the previous embodiment described with reference to FIGS. 3A to 3J and FIGS. 4A to 4C. Thus, differences between the present embodiment and the previous embodiment will be mainly described hereinafter.

Figure 5A:
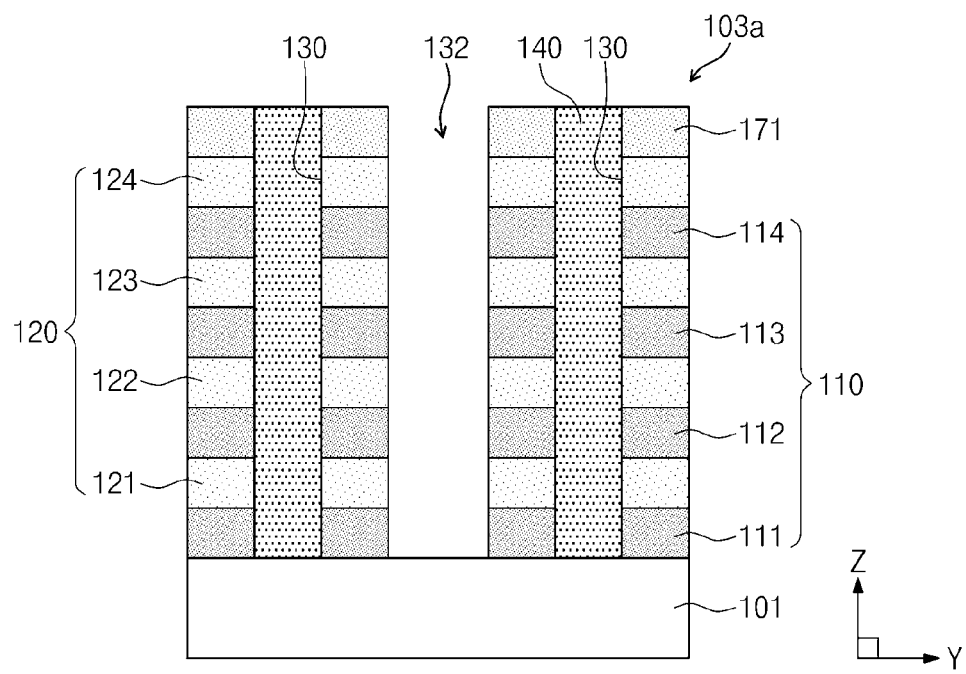
FIGS. 5A to 5F illustrate vertical sectional views of stages in a method of fabricating a semiconductor device, according to an exemplary embodiment.

Referring to FIG. 5A, a mold stack 103a may be formed on a substrate 101. The mold stack 103a may be formed to include a first sacrificial layer group 110, a second sacrificial layer group 120, and a capping insulation layer 171. The first sacrificial layer group 110, the second sacrificial layer group 120, and the capping insulation layer 171 may be formed of material layers having a relatively high wet etching selectivity with respect to each other. However, the first sacrificial layer group 110, the second sacrificial layer group 120, and the capping insulation layer 171 may have a relatively low dry etching selectivity or no dry etching selectivity with respect to each other. The first sacrificial layer group 110 may include first sacrificial layers 111-114, and the second sacrificial layer group 120 may include second sacrificial layers 121-124. The mold stack 103a may be formed by alternately stacking the first sacrificial layers 111-114 and the second sacrificial layers 121-124. Thereafter, the capping insulation layer 171 may be stacked on the topmost layer of the first sacrificial layers 111-114 and the second sacrificial layers 121-124.

In an embodiment, the first sacrificial layers 111-114 may be formed of a silicon germanium (SiGe) layer, and the second sacrificial layers 121-124 may be formed of a silicon nitride (SiN or $Si_3N_4$) layer. The capping insulation layer 171 may be formed of a silicon oxide ($SiO_2$) layer. The capping insulation layer 171 may be formed as a topmost layer of the mold stack 103a, as mentioned above. The mold stack 103a may be patterned to form vertical channel holes 130 penetrating the mold stack 103a and exposing the substrate 101. The vertical channel holes 130 may be formed using a dry etching technique or a laser drilling technique. Vertical channels 140 may be formed in the vertical channel holes 130, respectively. The vertical channels 140 may be formed of a semiconductor material layer such as a silicon layer using, e.g., a deposition technique or an epitaxial growth technique. The vertical channels 140 may be formed to fill the vertical channel holes 130 and to contact the substrate 101. The mold stack 103a may be then patterned to form word line cuts 132 between the vertical channels 140.

Figure 5B:
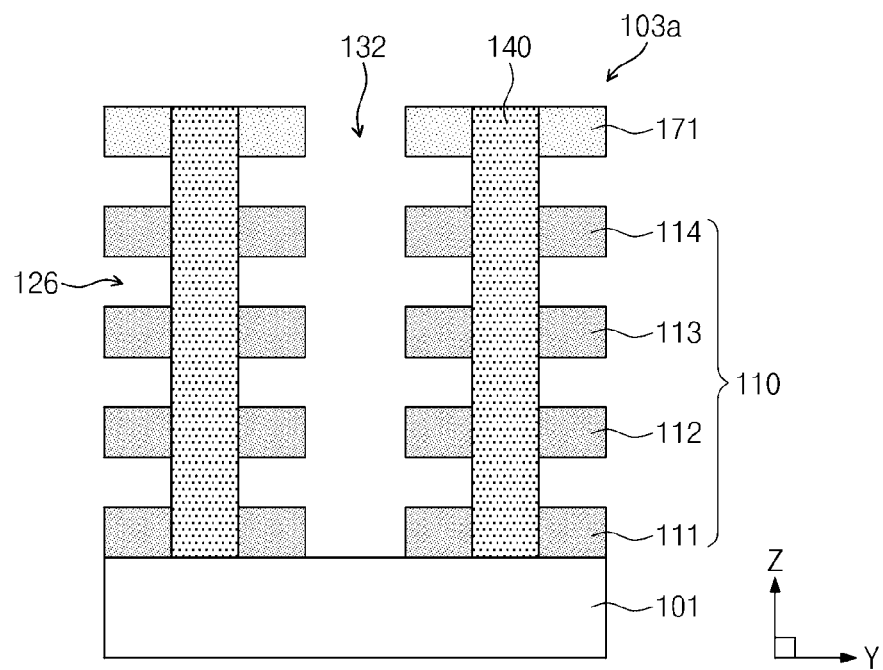

Referring to FIG. 5B, the second sacrificial layers 121-124 may be selectively removed using a wet etchant such as a phosphoric acid ($H_3PO_4$) solution. The wet etchant may be supplied through the word line cuts 132. As a result, recessed regions 126 may be formed between the first sacrificial layers 111-114. Further, the recessed regions 126 may also be formed between the topmost first sacrificial layer 114 and the capping insulation layer 171. Thus, the recessed regions 126 may expose sidewalls of the vertical channels 140. That is, the first sacrificial layers 111-114 and the capping insulation layer 171 may be vertically separated along the respective vertical channels 140 by the wet etching process.

Figure 5C:
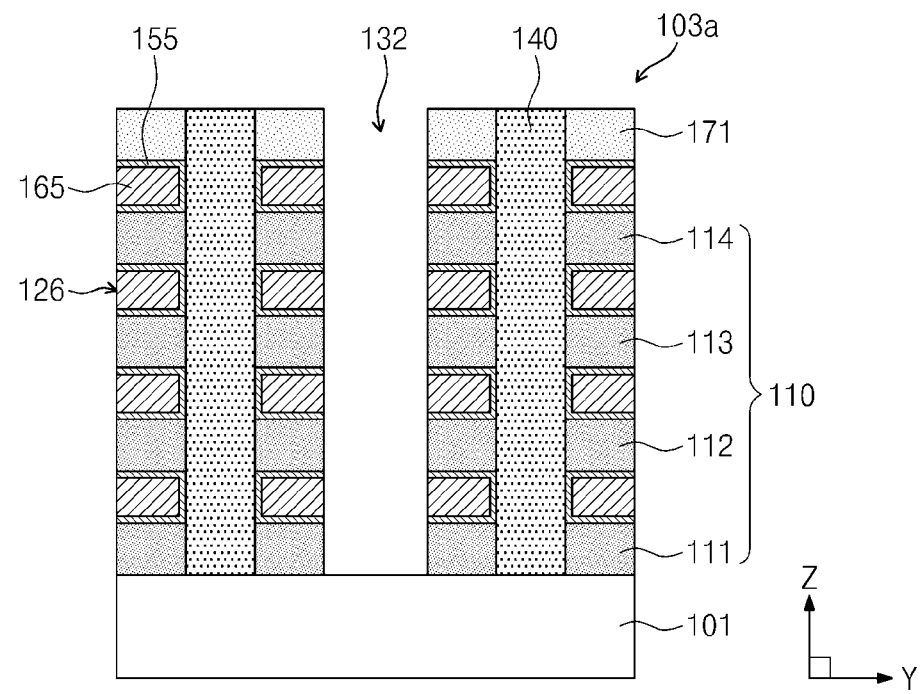

Referring to FIG. 5C, a data storage layer 155 and a gate 165 may be formed in each of the recessed regions 126. The data storage layer 155 may be formed by sequentially stacking a silicon oxide layer, a silicon nitride layer, and a silicon oxide layer. Alternatively, the data storage layer 155 may be formed by sequentially stacking a silicon oxide layer, a silicon nitride layer, and an aluminum oxide layer. The gate 165 may be formed by depositing a conductive layer such as a metal layer or a polysilicon layer and by selectively removing the conductive layer in the word line cuts 132.

Figure 5D:
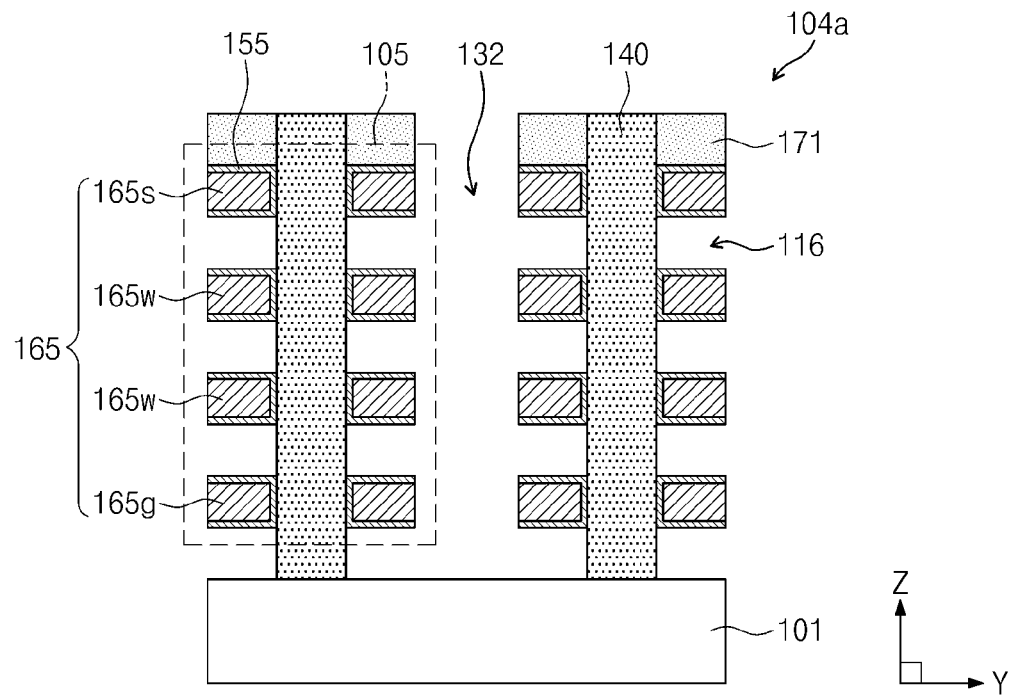

Referring to FIG. 5D, the first sacrificial layers 111-114 may be selectively removed by, e.g., supplying a hydrofluoric acid solution or a mixture of a hydrofluoric acid (HF) solution and a nitric acid ($HNO_3$) solution through the word line cuts 132. Thus, air gaps 116 may be formed between the gates 165. As a result, a gate stack 104a may be formed on the substrate 101. The gate stack 104a may include the gates 165 vertically separated along the respective vertical channels 140 by the air gaps 116. The gate stack 104a may also include the capping insulation layer 171 on the topmost gate, e.g., on a string selection gate 165s.

The gates 165 may include at least one string selection gate 165s, a plurality of memory gates 165w, and at least one ground selection gate 165g. Each of the string selection gate 165s and the ground selection gate 165g may constitute a non-memory transistor together with the corresponding vertical channel 140 and the corresponding data storage layer 155. Each of the memory gates 165w may constitute a memory transistor together with the corresponding vertical channel 140 and the corresponding data storage layer 155. The non-memory transistors and the memory transistors that are vertically stacked along one vertical channel 140 may constitute a single cell string 105.

Figure 5E:
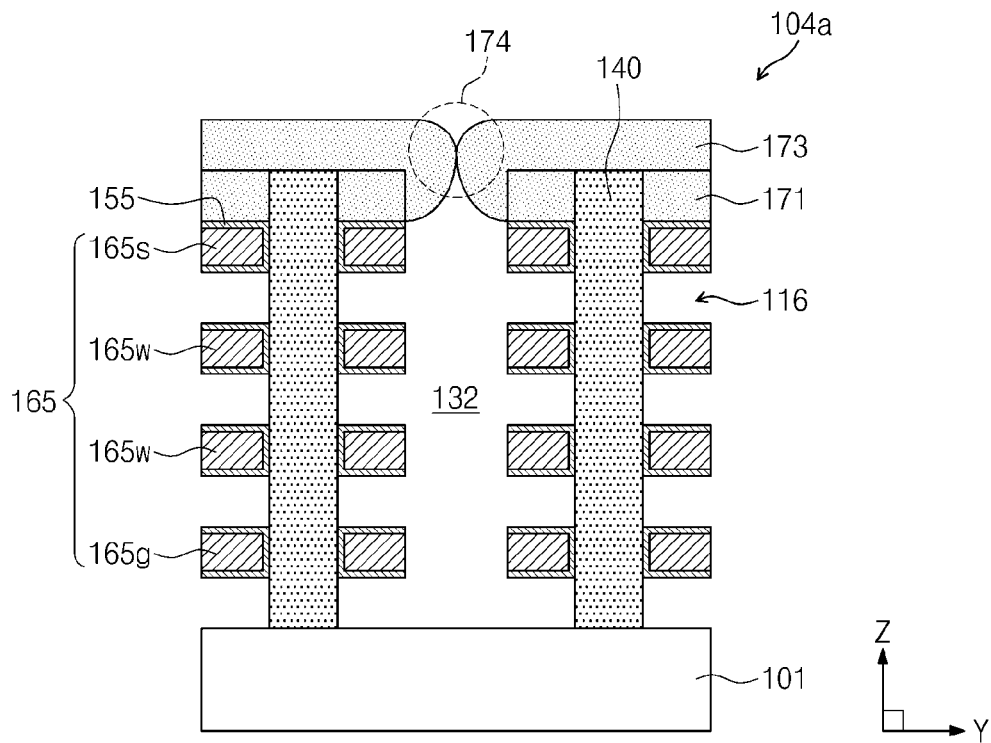

Referring to FIG. 5E, an insulation layer 173 may be formed on the substrate 101 having the air gaps 116. The insulation layer 173 may be formed of, e.g., at least one of a silicon oxide layer or a silicon nitride layer. The insulation layer 173 may be formed by using, e.g., a PVD technique or a CVD technique. The insulation layer 173 may be formed to exhibit a poor step coverage characteristic. That is, the insulation layer 173 may be formed to have overhangs 174 above the word line cuts 132. The overhangs 174 of the insulation layer 173 may be formed, e.g., easily formed, in the event that the capping insulation layer 171 is formed as a topmost layer of the gate stack 104a or the respective word line cuts 132 has a relatively high aspect ratio. If the insulation layer 173 is formed to have the overhangs 174 as described above, the word line cuts 132 may be hardly filled with the insulation layer 173. For example, adjacent overhangs 174 may contact each other so as to, e.g., reduce the possibility of the insulating layer 173 filling the word line cuts 132.

Figure 5F:
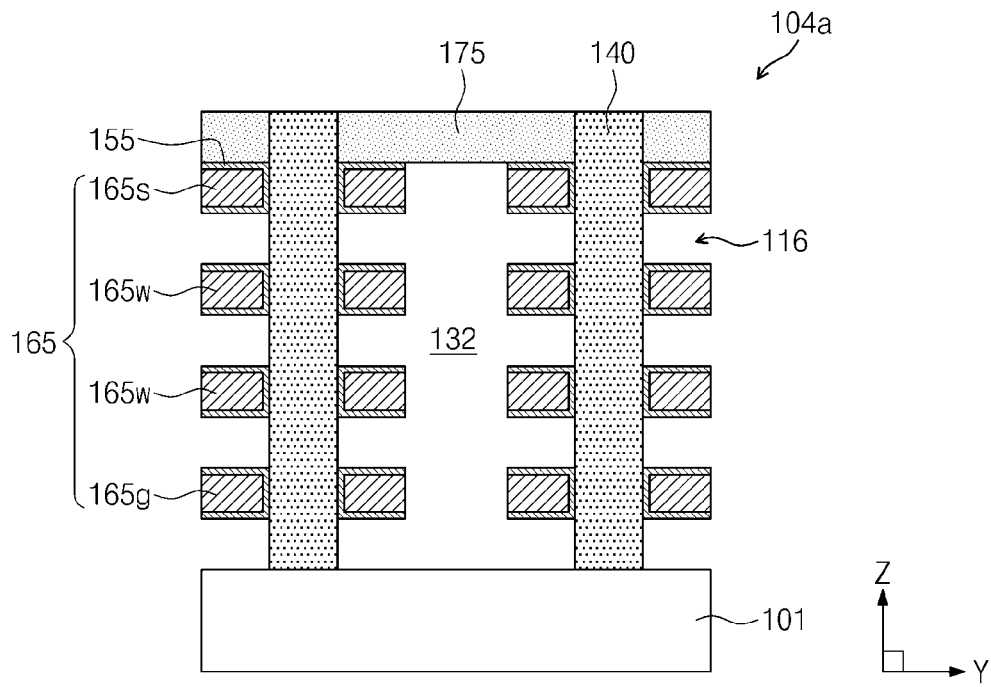

Referring the FIG. 5F, the insulation layers 171 and 173 may be planarized until top surfaces of the vertical channels 140 are exposed. As such, an insulation layer 175 that closes upper openings of the word line cuts 132, e.g., overlaps the openings so as to substantially completely cover the word line cuts 132. The insulation layer 175 may seal the word line cuts 132 and the air gaps 116 adjacent to the word line cuts 132. The word line cuts 132 closed off by the insulation layer 175 may have therein unfilled spaced, e.g., the unfilled spaces may include air therein. The unfilled spaces of the word line cuts 132 may be continuous with the air gaps 116. Planarization of the insulation layers 171 and 173 may be performed using, e.g., an etch-back process or a CMP technique.

According to an exemplary embodiment, a plurality of insulation layers 175 may be formed to cover the vertical channels 140. Each insulation layer 175 may extend between adjacent vertical channels 140 to cover the uppermost gate 165 and the word line cut 132, e.g., as illustrated in FIG. 5F. The gates 165 may be insulated from each other by the air gaps 116, and the upper openings of the word line cuts 132 may be closed, e.g., sealed, by the insulation layer 175. Thus, the word line cuts 132 may be filled with the air, e.g., like the empty spaces between the gates 165 vertically stacked. Further, each of the gates 165 may be formed to have an edge serving as a word line pad 167, as illustrated in FIG. 4C.

Third Exemplary Method Embodiment

FIGS. 6A to 6F illustrate vertical sectional views in stages of a method of fabricating a semiconductor device according to another exemplary embodiment. In the following embodiment, differences between the present embodiment and the first method embodiment illustrated in FIGS. 3A to 3J and FIGS. 4A to 4C will be mainly described hereinafter.

Figure 6A:
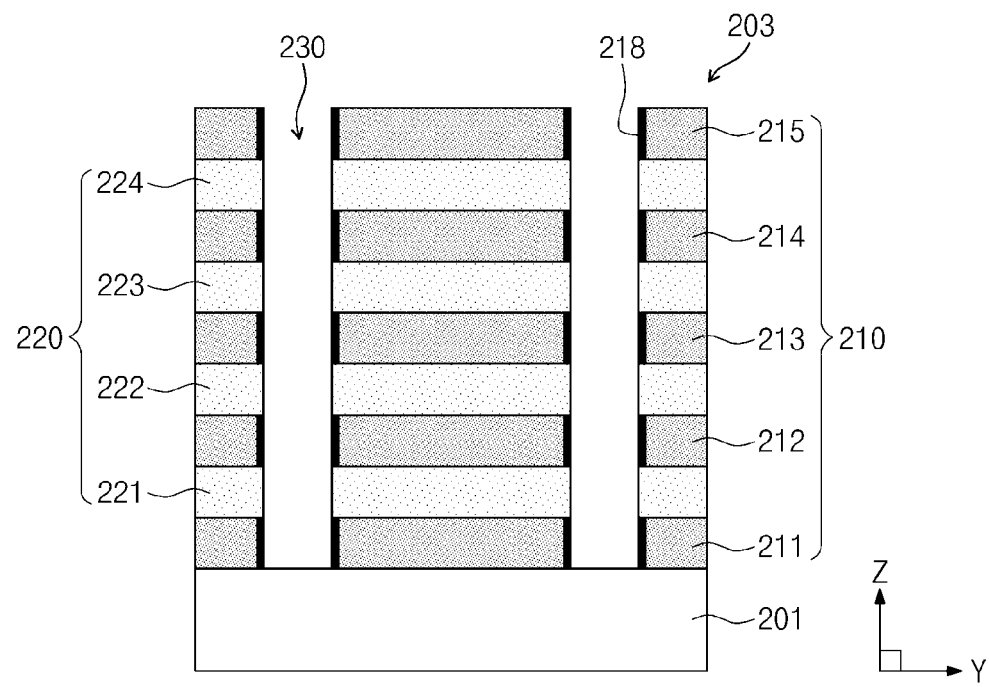
FIGS. 6A to 6F illustrate vertical sectional views of stages in a method of fabricating a semiconductor device, according to an exemplary embodiment.

Referring to FIG. 6A, a mold stack 203 may be formed on a substrate 201. The mold stack 203 may be formed to include a first sacrificial layer group 210 and a second sacrificial layer group 220. The first sacrificial layer group 210 and the second sacrificial layer group 220 may be formed of material layers having a relatively high wet etching selectivity with respect to each other, and the first sacrificial layer group 210 and the second sacrificial layer group 220 may have a relatively low dry etching selectivity or no dry etching selectivity with respect to each other. The first sacrificial layer group 210 may include first sacrificial layers 211-215. The second sacrificial layer group 220 may include second sacrificial layers 221-224. The mold stack 203 may be formed by alternately stacking the first sacrificial layers 211-215 and the second sacrificial layers 221-224. In an embodiment, the first sacrificial layers 211-215 may be formed of a silicon germanium (SiGe) layer, and the second sacrificial layers 221-224 may be formed of a silicon nitride (SiN or $Si_3N_4$) layer.

The mold stack 203 may be patterned to form vertical channel holes 230 penetrating the mold stack 203 and exposing sidewalls of the first sacrificial layers 211-215. The exposed sidewalls of the first sacrificial layers 211-215 may be oxidized to form a protection layer 218. According to an exemplary embodiment, if the first sacrificial layers 211-215 are formed of the silicon germanium (SiGe) layer, the protection layer 218 may be a silicon germanium oxide (SiGeOx) layer.

Figure 6B:
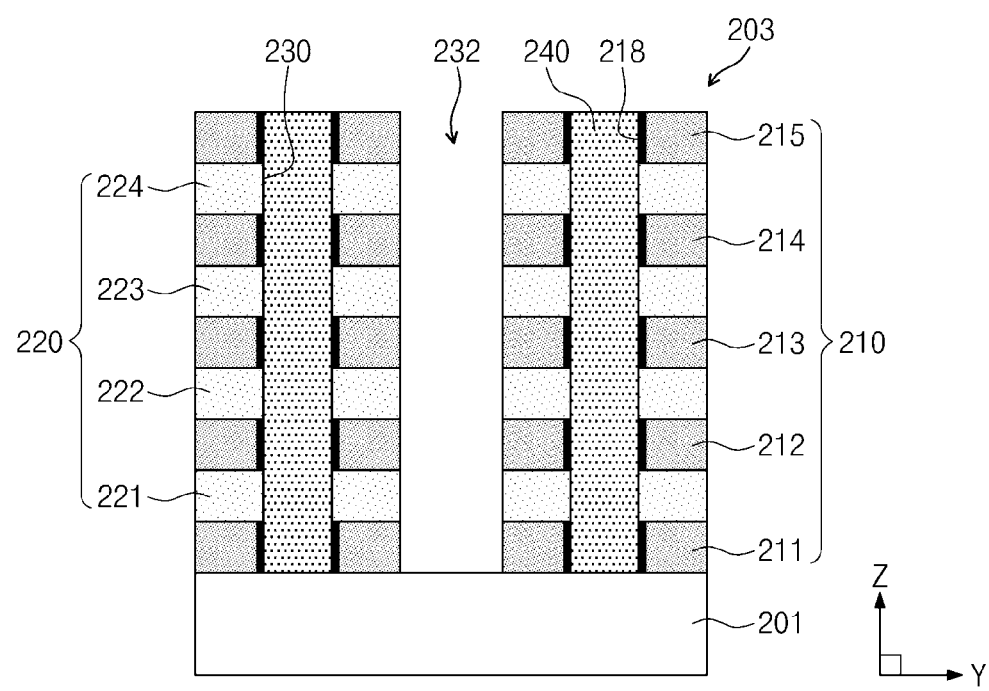

Referring to FIG. 6B, vertical channels 240 may be formed in the vertical channel holes 230, respectively. The vertical channels 240 may be formed to fill the vertical channel holes 230 and to contact the substrate 201. The vertical channels 240 may be formed of, e.g., a semiconductor layer. The mold stack 203 may be then patterned using a dry etching technique, thereby forming word line cuts 132 between the vertical channels 240. The word line cuts 232 may expose the substrate 201. The word line cuts 232 may be formed to have, e.g., a trench shape and to extend in the x-axis direction as illustrated in FIG. 1B.

Figure 6C:
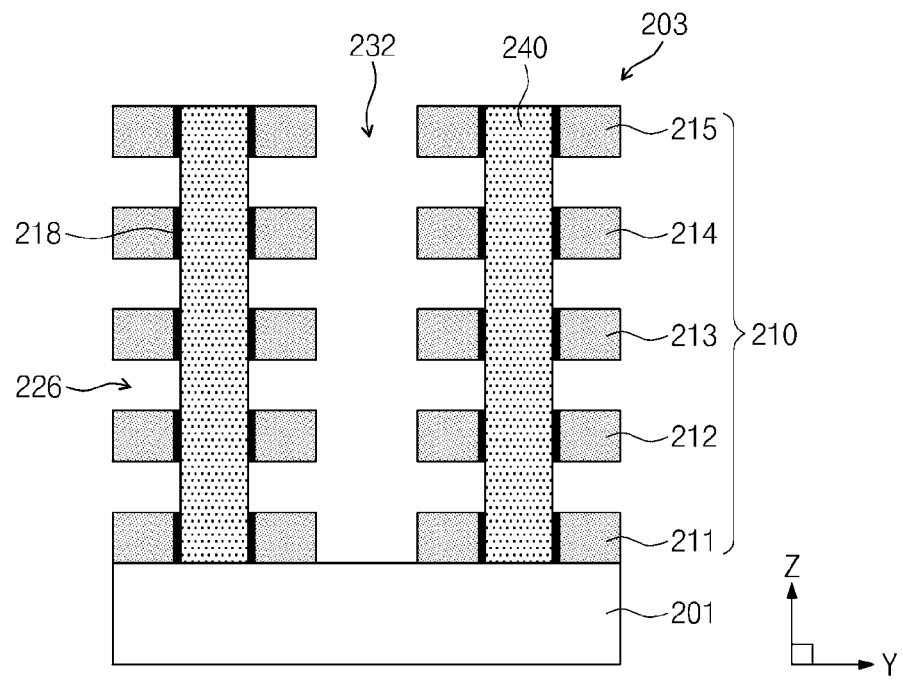

Referring to FIG. 6C, the second sacrificial layers 221-224 may be selectively removed using a wet etchant such as a phosphoric acid ($H_3PO_4$) solution. The wet etchant may be supplied through the word line cuts 232. As a result, recessed regions 226 may be formed between the first sacrificial layers 211-215. The recessed regions 226 may expose sidewalls of the vertical channels 240 between the first sacrificial layers 211-215. That is, the first sacrificial layers 211-215 may be vertically separated along the respective vertical channels 240 by the recessed regions 226.

Figure 6D:
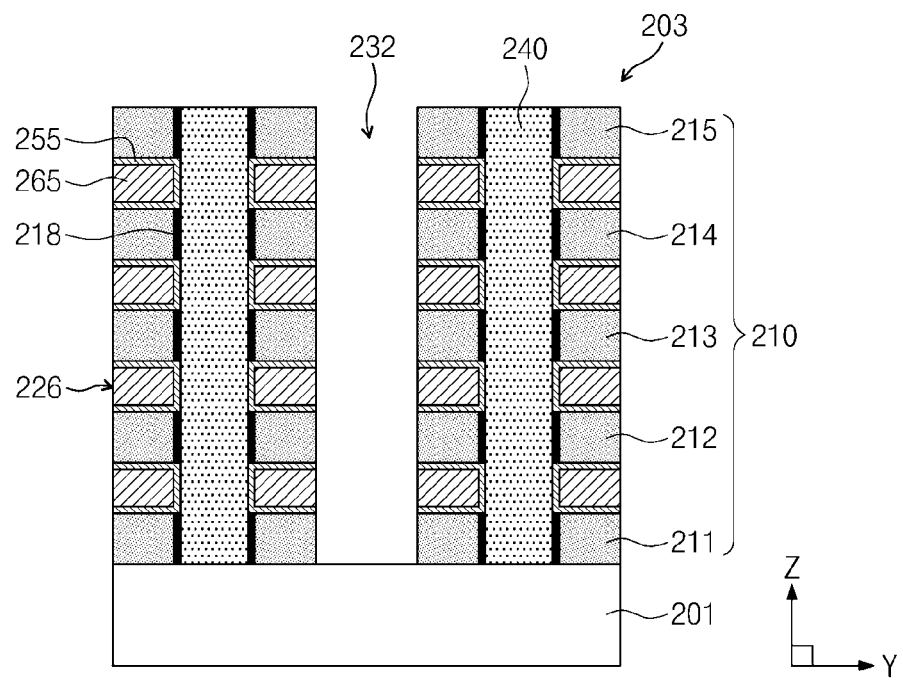

Referring to FIG. 6D, a data storage layer 255 and a gate 265 may be formed in each of the recessed regions 226. The data storage layer 255 may be formed to have a multi-layered structure including a tunneling insulation layer 251, a trapping insulation layer 252 on the tunneling insulation layer 251, and a blocking insulation layer 253 on the trapping insulation layer 252, e.g., as illustrated in FIG. 2B. According to an exemplary embodiment, the tunneling insulation layer 251 may be formed of a silicon oxide layer, the trapping insulation layer 252 may be formed of a silicon nitride layer, and the blocking insulation layer 253 may be formed of a silicon oxide layer or an aluminum oxide layer. The gates 265 may be formed by depositing a conductive layer such as a metal layer or a polysilicon layer and by selectively removing the conductive layer in the word line cuts 232.

Figure 6E:
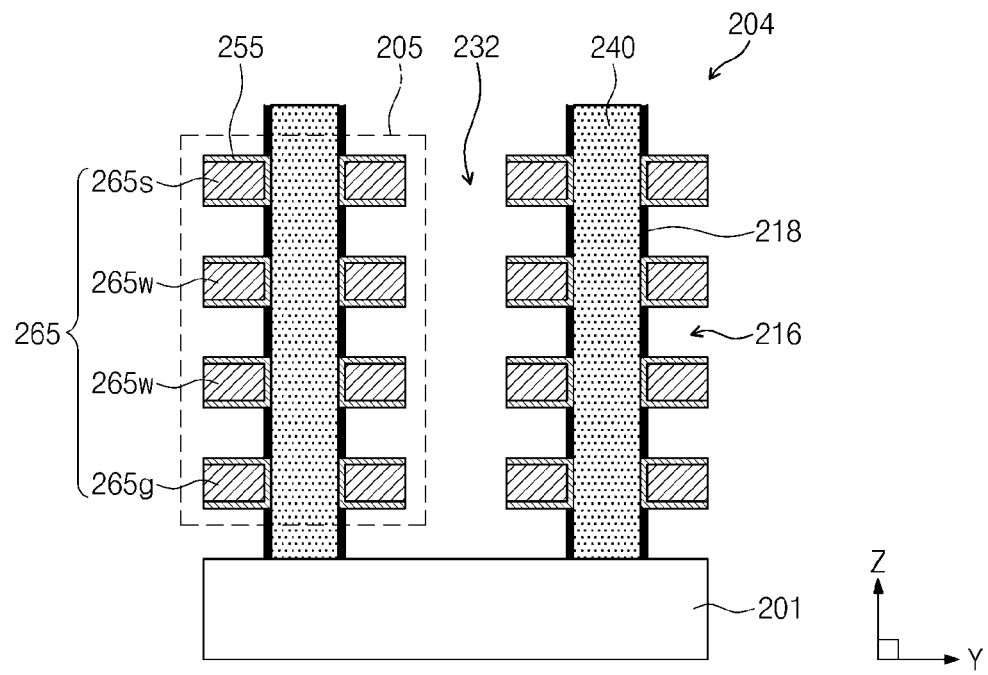

Referring to FIG. 6E, the first sacrificial layers 211-215 may be selectively removed by supplying, e.g., a hydrofluoric acid (HF) solution or a mixture of a hydrofluoric acid (HF) solution and a nitric acid ($HNO_3$) solution through the word line cuts 232. Thus, air gaps 216 may be formed between the gates 265. As a result, a gate stack 204 may be formed on the substrate 201. The gate stack 204 may include the gates 265 vertically separated along the respective vertical channels 240 by the air gaps 216.

The gates 265 may include at least one string selection gate 265s, a plurality of memory gates 265w, and at least one ground selection gate 265g. Each of the string selection gate 265s and the ground selection gate 165g may constitute a non-memory transistor together with the corresponding vertical channel 240 and the corresponding data storage layer 255. Each of the memory gates 265w may constitute a memory transistor together with the corresponding vertical channel 240 and the corresponding data storage layer 255. The non-memory transistors and the memory transistors, which may be vertically stacked along each vertical channel 240, may constitute a single cell string 205.

When the first sacrificial layers 211-215 are selectively removed by the wet etching process, sidewalls of the vertical channels 240 may be damaged by the wet etchant. However, according to an exemplary embodiment, the protection layers 218 may reduce the possibility of and/or prevent the sidewalls of the vertical channels 240 from being damaged by the wet etchant during the wet etching process.

Figure 6F:
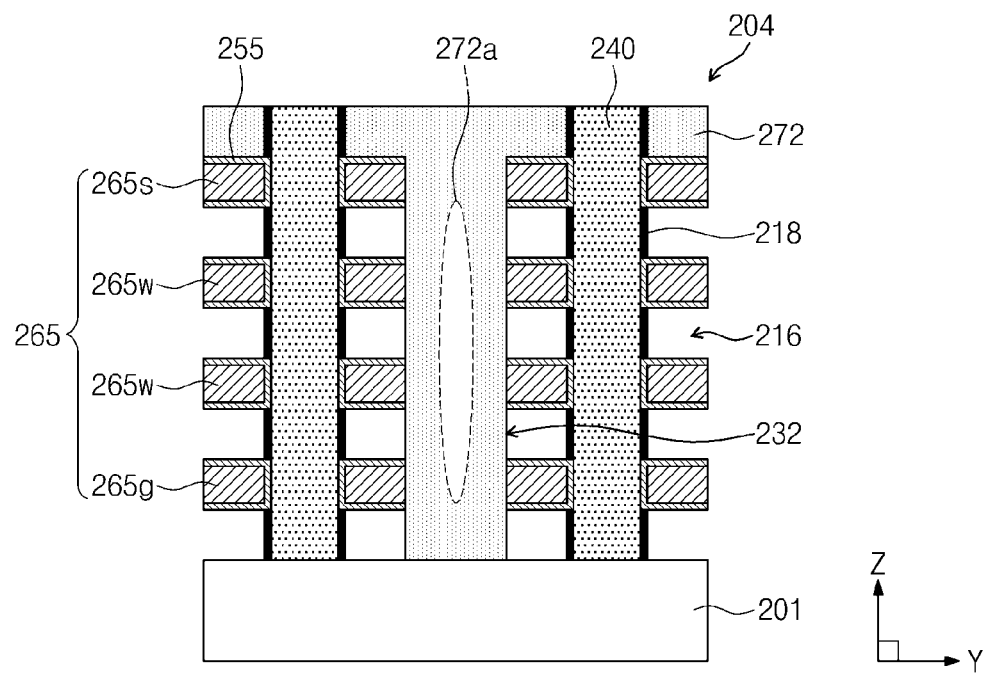

Referring to FIG. 6F, an insulation layer 272 may be formed on the substrate having the air gaps 216. In an embodiment, the insulation layer 272 may be formed of a silicon oxide layer using, e.g., a PVD technique or a CVD technique. The insulation layer 272 may be formed such that the insulation layer 272 may exhibit a poor step coverage characteristic. For example, the word line cuts 232 may not be completely filled with the insulation layer 272. Thus, the insulation layer 272 may be formed to have a void 272a in each of the word line cuts 232. The insulation layer 272 may be planarized using an etch-back process or a CMP technique until top surfaces of the vertical channels 240 are exposed. Alternatively, the insulation layer 272 may be formed to cover the vertical channels 240.

Fourth Exemplary Method Embodiment

FIGS. 7A to 7D illustrate vertical sectional views of stages in a method of fabricating a semiconductor device according to still another exemplary embodiment. This embodiment is similar to the previous embodiment described with reference to FIGS. 6A to 6F. Thus, differences between the present embodiment and the previous embodiment illustrated in FIGS. 6A to 6F will be mainly described hereinafter.

Figure 7A:
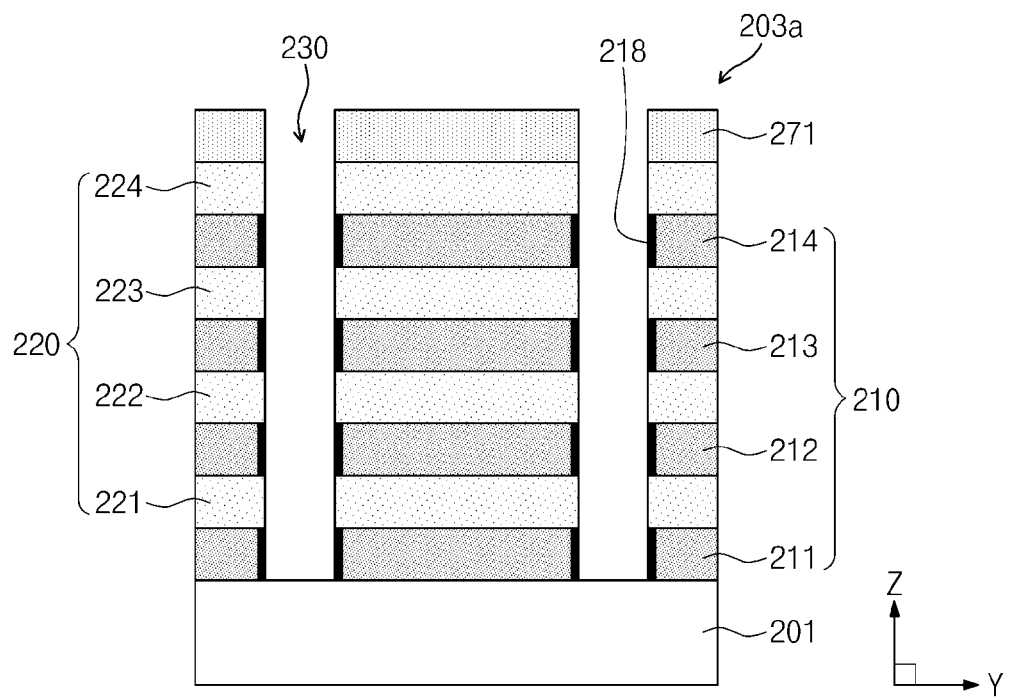
FIGS. 7A to 7D illustrate vertical sectional views of stages in a method of fabricating a semiconductor device, according to an exemplary embodiment.

Referring to FIG. 7A, a mold stack 203a may be formed on a substrate 201. The mold stack 203a may be formed to include a first sacrificial layer group 210, a second sacrificial layer group 220 and a capping insulation layer 271. The first sacrificial layer group 210, the second sacrificial layer group 220, and the capping insulation layer 271 may be formed of material layers having a relatively high wet etching selectivity with respect to each other. The first sacrificial layer group 210, the second sacrificial layer group 220, and the capping insulation layer 271 may have a relatively low dry etching selectivity or no dry etching selectivity with respect to each other. The first sacrificial layer group 210 may include first sacrificial layers 211-214. The second sacrificial layer group 220 may include second sacrificial layers 221-224. The mold stack 203a may be formed by alternately stacking the first sacrificial layers 211-214 and the second sacrificial layers 221-224. The capping insulation layer 271 may be stacked as the topmost layer of the mold stack 203a. According to an exemplary embodiment, the first sacrificial layers 211-214 may be formed of a silicon germanium (SiGe) layer, the second sacrificial layers 221-224 may be formed of a silicon nitride (SiN or $Si_3N_4$) layer, and the capping insulation layer 271 may be formed of a silicon oxide ($SiO_2$) layer.

The mold stack 203a may be patterned to form vertical channel holes 230 penetrating the mold stack 203a and exposing the substrate 201. The vertical channel holes 230 may also expose sidewalls of the first sacrificial layers 211-214. The exposed sidewalls of the first sacrificial layers 211-214 may be oxidized to form a protection layer 218. In an exemplary embodiment, the protection layer 218 may be a silicon germanium oxide (SiGeOx) layer.

Figure 7B:
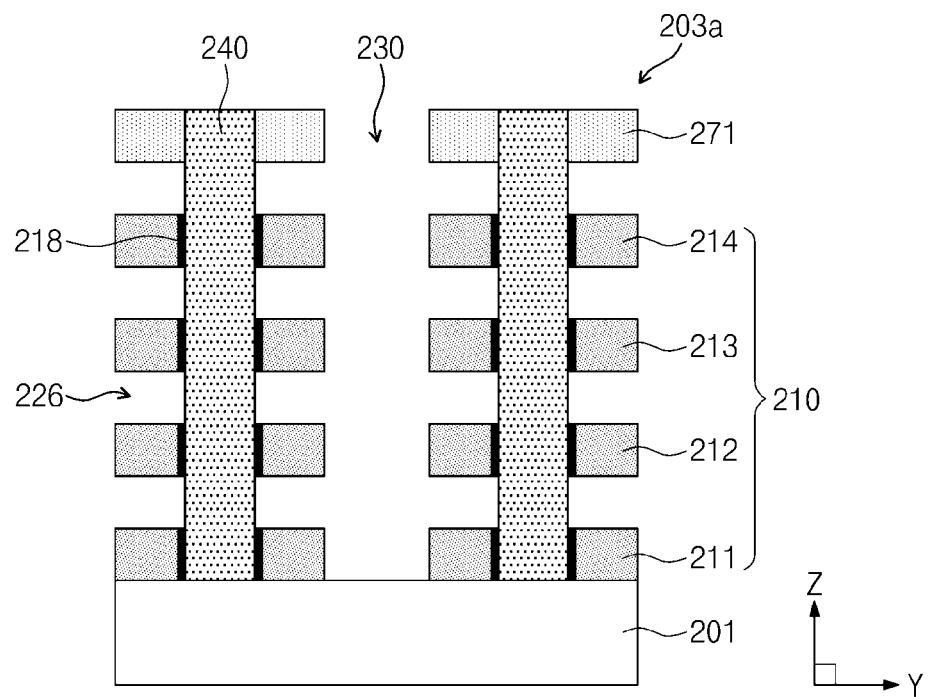

Referring to FIG. 7B, vertical channels 240 may be formed in the vertical channel holes 230, respectively. The vertical channels 240 may be formed to fill the vertical channel holes 230 and to contact the substrate 201. The vertical channels 240 may be formed of, e.g., a semiconductor layer. The mold stack 203a may be then patterned using a dry etching technique, thereby forming word line cuts 232 between the vertical channels 240. The second sacrificial layers 221-224 may be selectively removed using a wet etchant such as a phosphoric acid ($H_3PO_4$) solution. The wet etchant may be supplied through the word line cuts 232. As a result, recessed regions 226 may be formed between the first sacrificial layers 211-214. Further, the recessed regions 226 may also be formed between the topmost first sacrificial layer 214 and the capping insulation layer 271. Thus, the recessed regions 226 may expose sidewalls of the vertical channels 240.

Figure 7C:
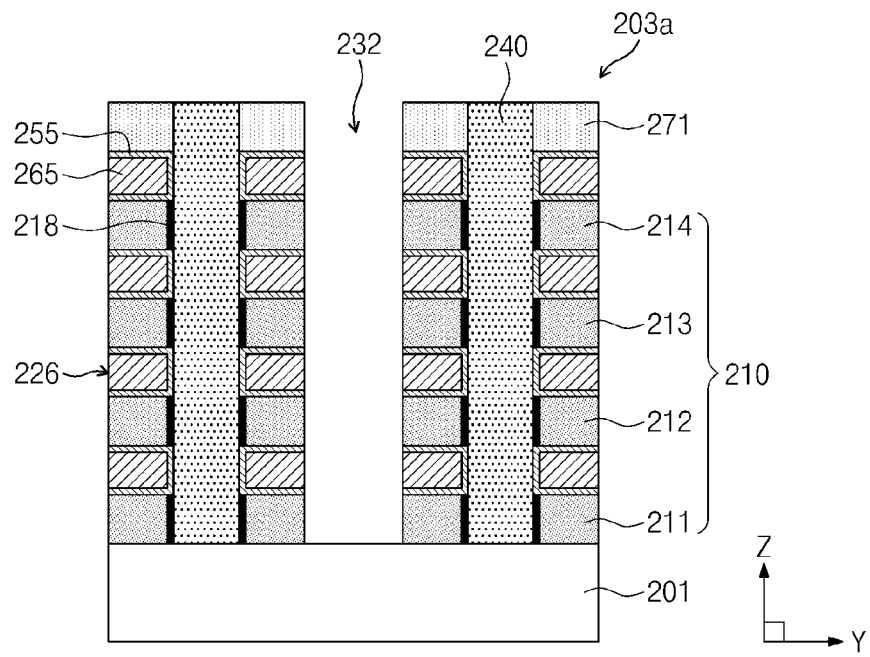

Referring to FIG. 7C, a data storage layer 255 and a gate 265 may be formed in each of the recessed regions 226. The data storage layer 255 may be formed by, e.g., sequentially stacking a silicon oxide layer, a silicon nitride layer, and a silicon oxide layer. Alternatively, the data storage layer 255 may be formed by, e.g., sequentially stacking a silicon oxide layer, a silicon nitride layer, and an aluminum oxide layer. The gate 265 may be formed by depositing a conductive layer such as a metal layer or a polysilicon layer and by selectively removing the conductive layer in the word line cuts 232.

Figure 7D:
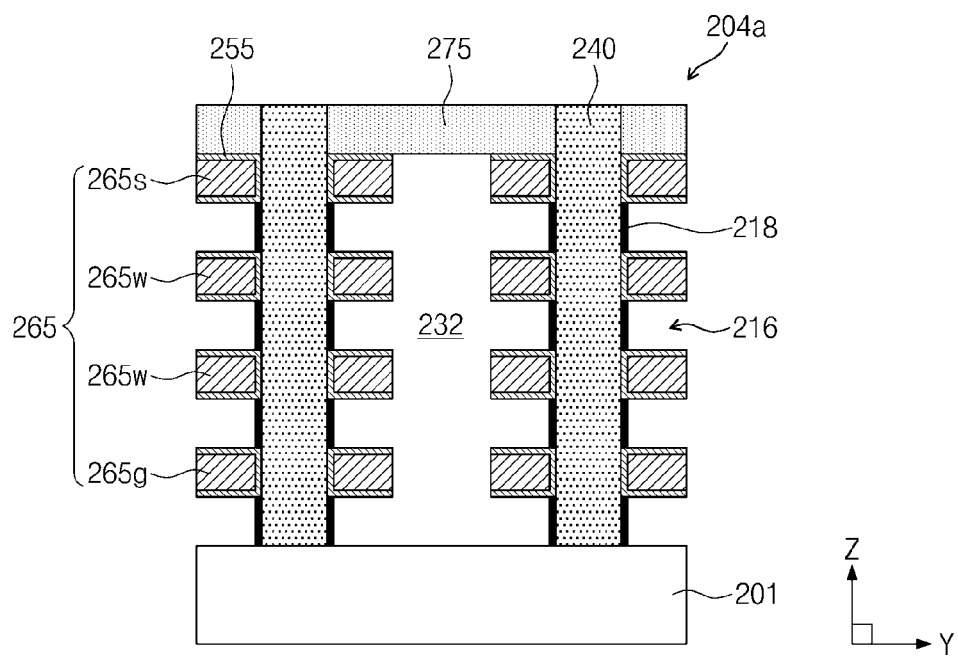

Referring to FIG. 7D, a gate stack 204a may be formed on the substrate 201. The gate stack 204a may include the gates 265 which are vertically separated by air gaps 216 along the respective vertical channels 240. For example, the first sacrificial layers 211-214 may be selectively removed by supplying a hydrofluoric acid (HF) solution or a mixture of a hydrofluoric acid (HF) solution and a nitric acid ($HNO_3$) solution through the word line cuts 232. Thus, the air gaps 216 may be formed between the gates 265. The protection layers 218 may reduce the possibility of and/or prevent sidewalls of the vertical channels 240 from being damaged by the wet etchant during the wet etching process. An insulation layer 275 may be formed on the substrate 201 including the air gaps 216. The insulation layer 275 may be formed to close upper openings of the word line cuts 232, e.g., to seal upper openings of the word line cuts 232 and to seal the air gaps 216. For example, using the same manners as described with reference to FIGS. 5E and 5F, an insulation layer, e.g., a silicon oxide layer or a silicon nitride layer, may be formed on the gate stack 204a including the air gaps 216. For example, the insulation layer may be formed to have overhangs. The insulation layer and the capping insulation layer 271 may be then planarized to form the insulation layer 275.

Fifth Exemplary Method Embodiment

FIGS. 8A to 8D are vertical sectional views illustrating a method of fabricating a semiconductor device according to still yet another embodiment. In the following embodiment, differences between the present embodiment and the first method embodiment illustrated in FIGS. 3A to 3J and FIGS. 4A to 4C will be mainly described.

Figure 8A:
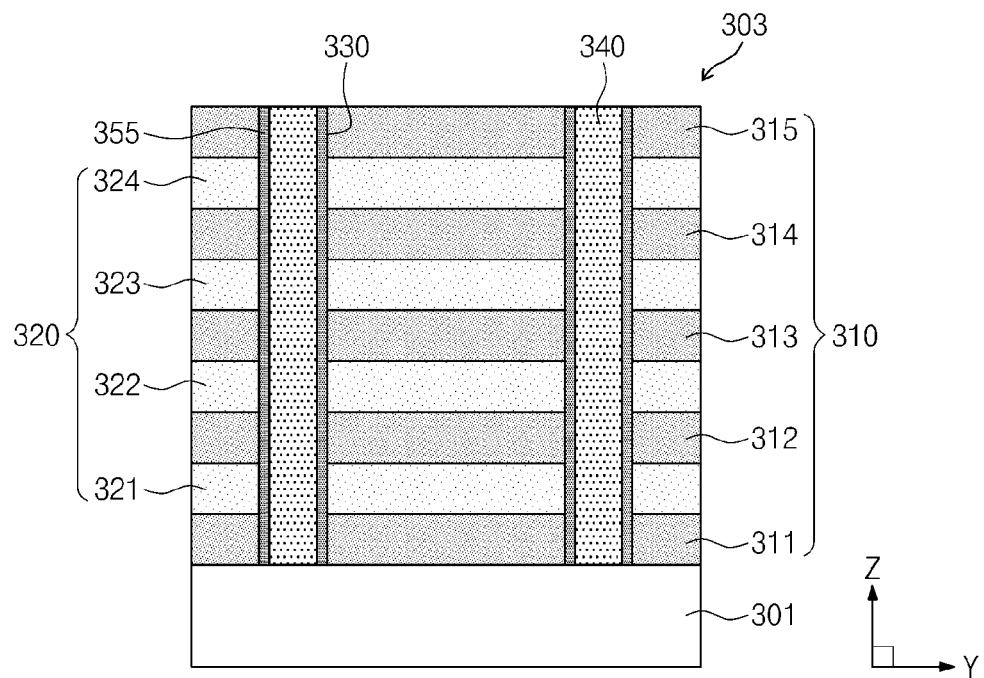
FIGS. 8A to 8D illustrate vertical sectional views of stages in a method of fabricating a semiconductor device, according to an exemplary embodiment.

Referring to FIG. 8A, a first sacrificial layer group 310 and a second sacrificial layer group 320 may be deposited on a substrate 301, thereby foaming a mold stack 303. The first sacrificial layer group 310 may include a plurality of first sacrificial layers 311-315 formed of a silicon germanium (SiGe) layer. The second sacrificial layer group 320 may include a plurality of second sacrificial layers 321-324 formed of a silicon nitride (SiN or $Si_3N_4$) layer. According to the present embodiment, distances between the first sacrificial layers 311-315 may be less than distances between the first sacrificial layers 111-115, e.g., as illustrated in FIG. 3A. Thus, an overall height of the mold stack 303 may be reduced. Further, a height of recessed regions 326 illustrated in FIG. 8C, which are to be formed by removing the second sacrificial layers 321-324, may be reduced compared to other exemplary embodiments. This may be clearly understood from FIG. 8C.

The mold stack 303 may be patterned to form vertical channel holes 330 penetrating the mold stack 303 and exposing the substrate 301. The mold stack 303 may be patterned using, e.g., a dry etching technique or a laser drilling technique. A data storage layer 355 and a vertical channel 340 may be formed in each of the vertical channel holes 330. The data storage layer 355 may vertically extend along the respective vertical channels 340. Further, the data storage layer 355 may be formed to surround the respective vertical channels 340. The data storage layer 355 may be formed by sequentially stacking a blocking insulation layer 353, a trapping insulation layer 352, and a tunneling insulation layer 351, e.g., as illustrated in FIG. 2C. Each of the vertical channels 340 may be formed to have, e.g., a pillar shape surrounded by the data storage layer 355. The vertical channels 340 may be formed to contact the substrate 301.

Figure 8B:
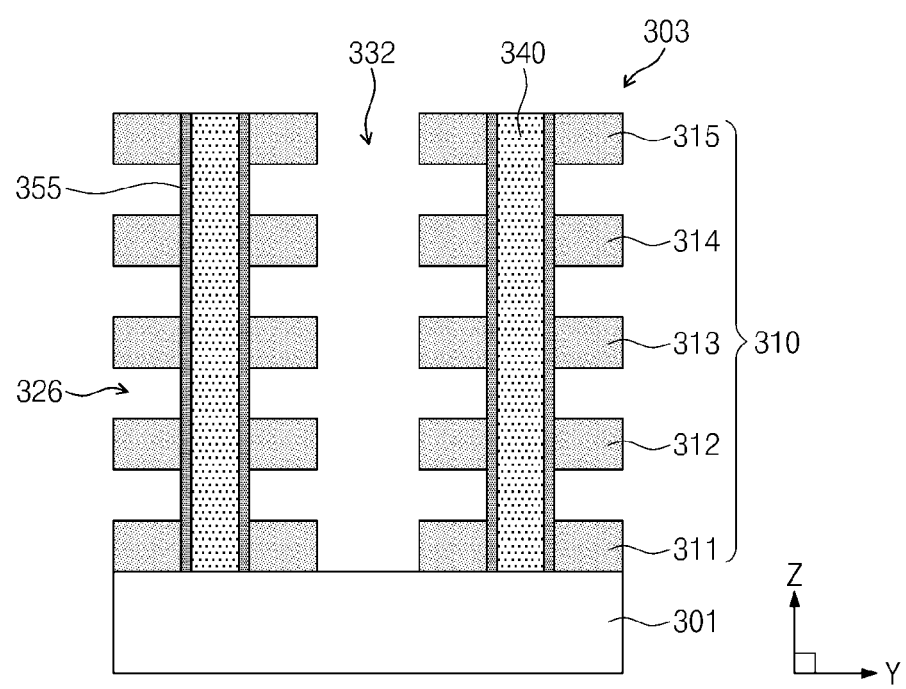

Referring to FIG. 8B, the mold stack 303 may be patterned to form word line cuts 332 between the vertical channels 340. The mold stack 303 may be patterned using, e.g., a dry etching technique. The second sacrificial layers 321-324 may be selectively removed by supplying a wet etchant such as a phosphoric acid ($H_3PO_4$) solution through the word line cuts 332. As a result, recessed regions 326 may be formed between the first sacrificial layers 311-315. The recessed regions 326 may expose the data storage layers 355. The vertical channels 340 may be covered, e.g., the sidewalls of the vertical channels 340 may be entirely covered with the data storage layers 355, during the wet etching process for removing the second sacrificial layers 321-324. Further, an outermost layer of each of the data storage layers 355 may correspond to the blocking layer 353 formed of a silicon oxide layer or an aluminum oxide layer. Thus, the vertical channels 340 as well as the blocking layers 353 may not be damaged by the phosphoric acid ($H_3PO_4$) solution during the wet etching process.

Figure 8C:
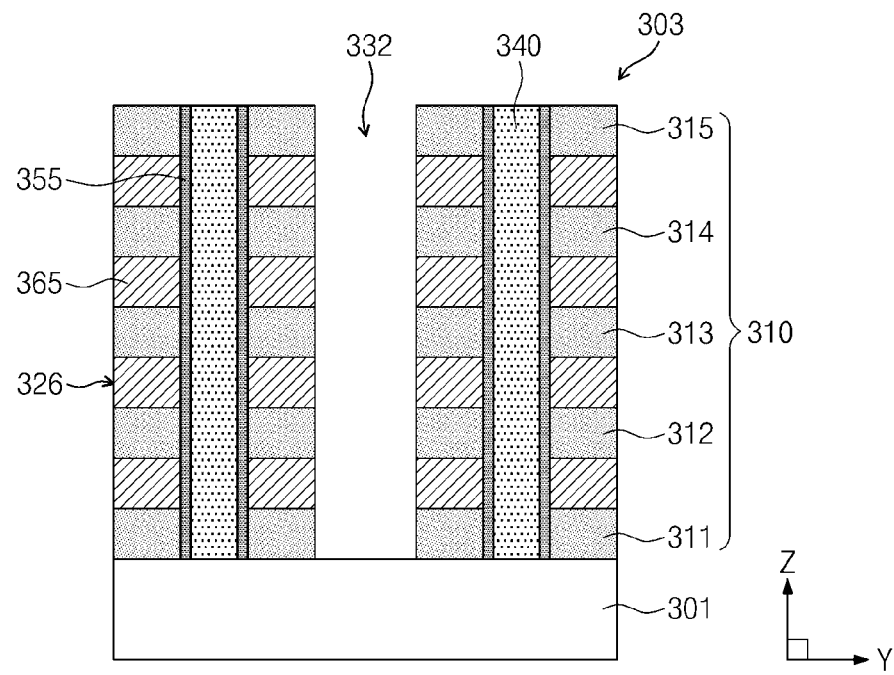

Referring to FIG. 8C, gates 365 may be formed in the recessed regions 326. For example, a metal layer such as a tungsten layer may be formed to fill the recessed regions 326 and the word line cuts 332. The metal layer in the word line cuts 332 may be selectively removed using, e.g., a dry etching technique or a wet etching technique, to form the gates 365 in the recessed regions 326. According to an exemplary embodiment, the data storage layers 355 may not be formed in the recessed regions 326 between the first sacrificial layers 311-315. That is, a vertical height of the respective recessed regions 326 may be reduced by twice a thickness of the data storage layers 355 as compared with the above embodiments.

For example, a vertical height of the mold stack 303 may be reduced to lower a total height of the semiconductor memory device.

Figure 8D:
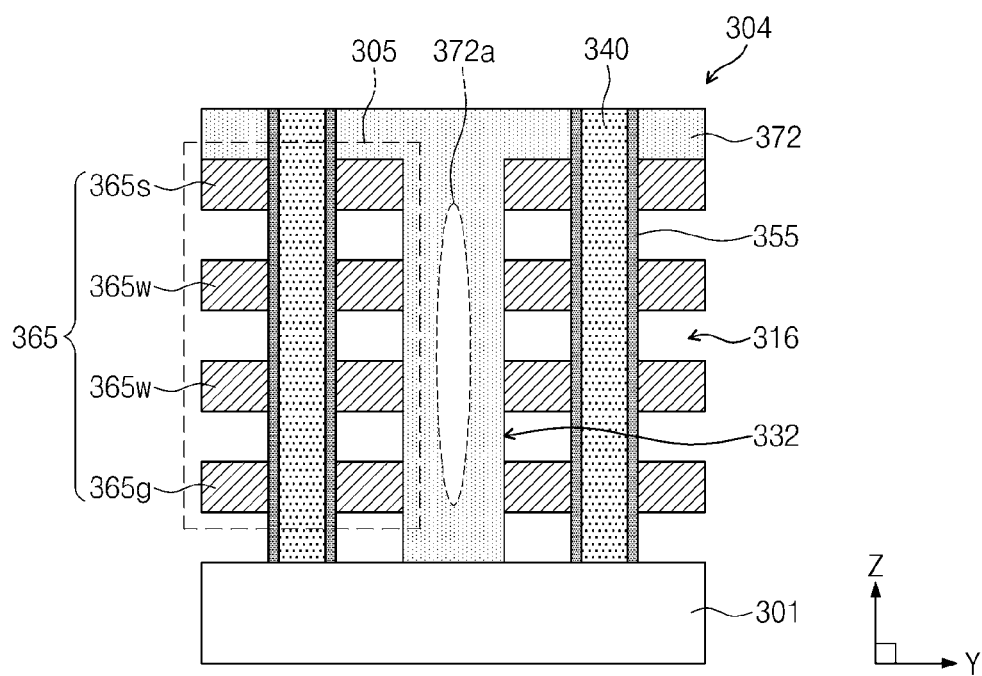

Referring to FIG. 8D, a gate stack 304 may be formed on the substrate 201. The gate stack 304 may include the gates 365 which are vertically separated by air gaps 316 along the respective vertical channels 340. In detail, the first sacrificial layers 311-315 may be selectively removed by supplying a hydrofluoric acid (HF) solution or a mixture of a hydrofluoric acid (HF) solution and a nitric acid (HNO3) solution through the word line cuts 332. Thus, the air gaps 316 may be formed between the gates 365 vertically stacked. The data storage layers 355 may reduce the possibility of and/or prevent the vertical channels 340 from being damaged by the wet etchant.

The gates 365 may include at least one string selection gate 365s, a plurality of memory gates 365w, and at least one ground selection gate 365g. Each of the string selection gate 365s and the ground selection gate 365g may constitute a non-memory transistor together with the corresponding vertical channel 340 and the corresponding data storage layer 355. Each of the memory gates 365w may constitute a memory transistor together with the corresponding vertical channel 340 and the corresponding data storage layer 355. The non-memory transistors and the memory transistors, which are vertically stacked along one vertical channel 340, may constitute a single cell string 305.

An insulation layer 372 may be formed in the word line cuts 332. In an embodiment, the insulation layer 372 may be formed using a PVD technique. In an exemplary embodiment, the insulation layer 372 may exhibit a poor step coverage characteristic. Thus, the insulation layer 372 may not be formed in the air gaps 316. However, the insulation layer 372 may partially fill the word line cuts 332. That is, the insulation layer 372 may be formed to have a void 372a in each of the word line cuts 332. The voids 372a may be formed to have a large size. In this case, the voids 372a may be connected to the air gaps 316 adjacent thereto.

Sixth Exemplary Method Embodiment

FIGS. 9A to 9D illustrate vertical sectional of stages in a method of fabricating a semiconductor device according to a further exemplary embodiment. This embodiment is similar to the previous embodiment described with reference to FIGS. 8A to 8D. Thus, differences between the present embodiment and the previous embodiment illustrated in FIGS. 8A to 8D will be mainly described hereinafter.

Figure 9A:
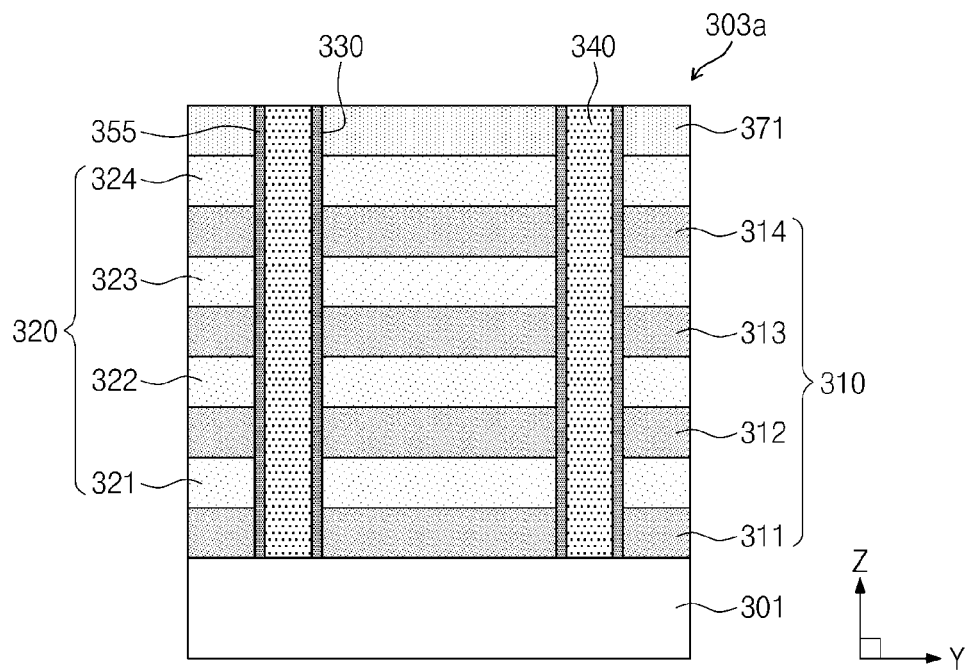
FIGS. 9A to 9D illustrate vertical sectional views of stages in a method of fabricating a semiconductor device, according to an exemplary embodiment.

Referring to FIG. 9A, a mold stack 303a may be formed on a substrate 301. The mold stack 303a may be formed using similar stages as described with reference to FIG. 5A. That is, the mold stack 303a may be formed to include a first sacrificial layer group 310, a second sacrificial layer group 320, and a capping insulation layer 371. The first sacrificial layer group 310 may be formed to include a plurality of first sacrificial layers 311-314. The second sacrificial layer group 320 may be formed to include a plurality of second sacrificial layers 321-324.

The capping insulation layer 371 may be formed to act as a topmost layer of the mold stack 303a. Further, the capping insulation layer 371 may be formed of a material layer having a wet etching selectivity with respect to the first and second sacrificial layer groups 310 and 320. For example, the capping insulation layer 371 may be formed of a silicon oxide layer. The mold stack 303a may be patterned to form vertical channel holes 330 penetrating the mold stack 303a. A data storage layer 355 and a vertical channel 340 may be formed in each of the vertical channel holes 330. The data storage layer 355 may be formed by, e.g., sequentially stacking a blocking insulation layer 353, a trapping insulation layer 352, and a tunneling insulation layer 351, as illustrated in FIG. 2C.

Figure 9B:
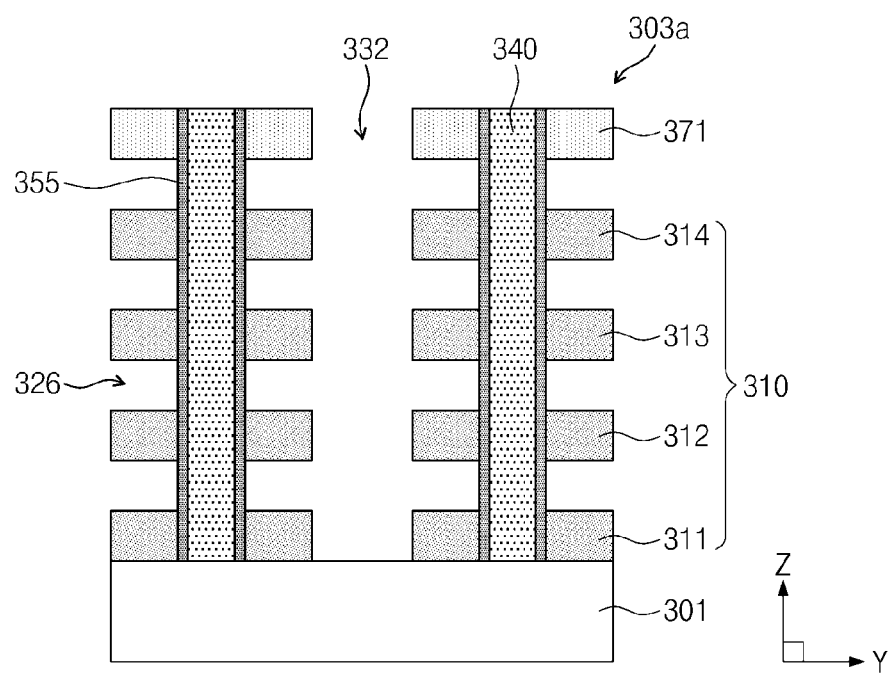

Referring to FIG. 9B, the mold stack 303a may be dry-etched to form word line cuts 332 between the vertical channels 340. The second sacrificial layers 321-324 may be selectively etched by supplying a wet etchant such as a phosphoric acid ($H_3PO_4$) solution through the word line cuts 332. As a result, recessed regions 326 may be formed between the first sacrificial layers 311-314 which are vertically stacked.

Figure 9C:
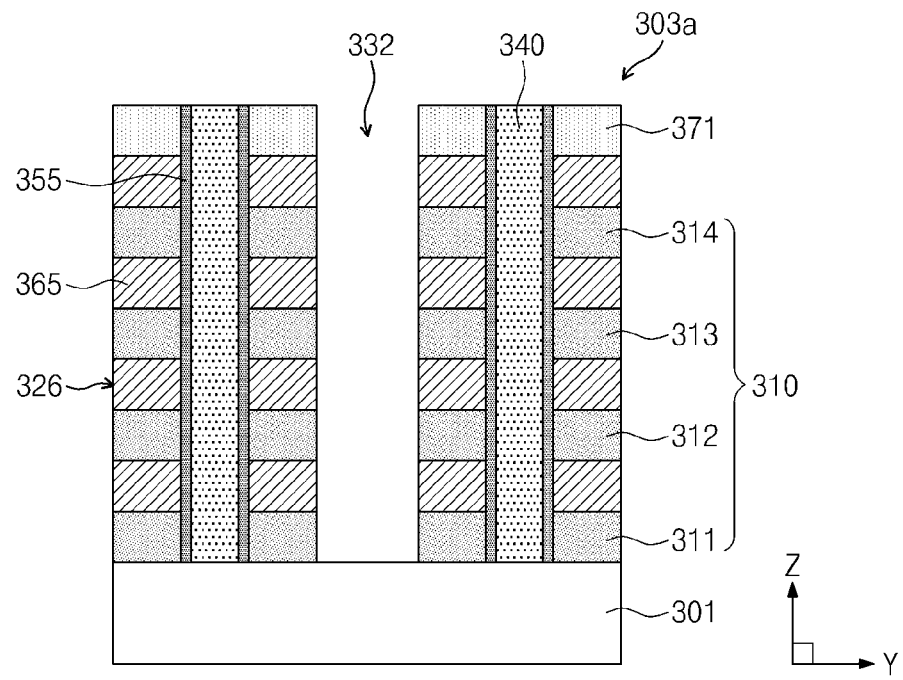

Referring to FIG. 9C, gates 365 may be formed in the recessed regions 326, respectively. For example, a metal layer may be formed to fill the recessed regions 326 and the word line cuts 332. The metal layer in the word line cuts 332 may be selectively removed to form the gates 365 in the recessed regions 326.

Figure 9D:
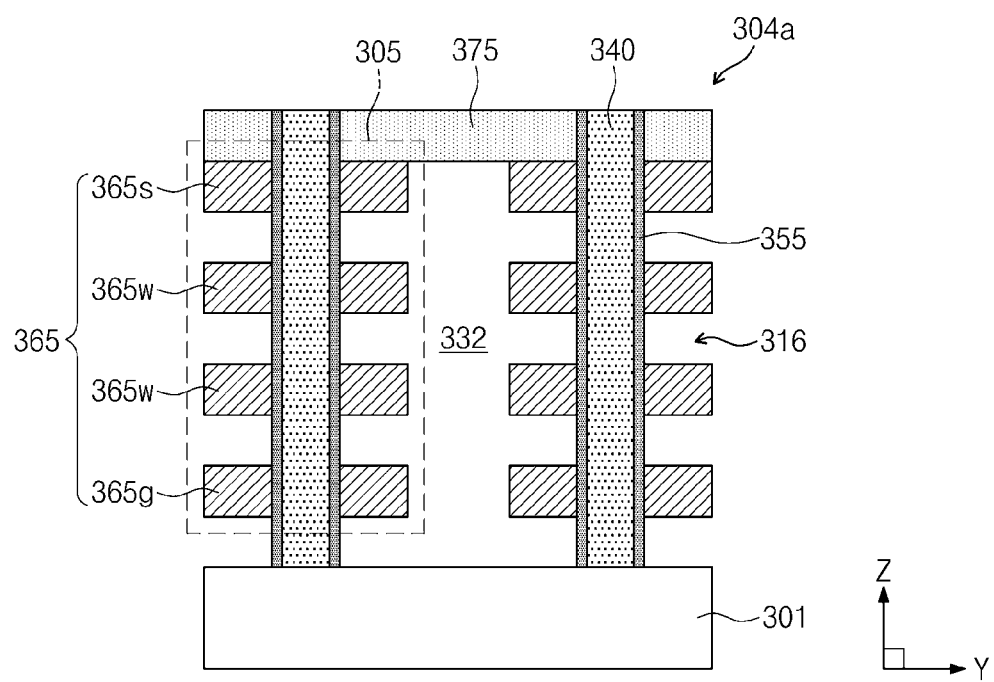

Referring to FIG. 9D, a gate stack 304a may be formed on the substrate 301. The gate stack 304 may include the gates 365, which may be vertically separated by air gaps 316 along the respective vertical channels 340. The first sacrificial layers 311-314 may be selectively removed by, e.g., supplying a hydrofluoric acid (HF) solution or a mixture of a hydrofluoric acid (HF) solution and a nitric acid ($HNO_3$) solution through the word line cuts 332. Thus, the air gaps 316 may be formed between the gates 365 that are vertically stacked. An insulation layer 375 may be then formed on the substrate 301 including the air gaps 316. The insulation layer 375 may be formed to close, e.g., seal, upper openings of the word line cuts 332. For example, using the same manners as described with reference to FIGS. 5E and 5F, an insulation layer such as a silicon oxide layer or a silicon nitride layer may be formed to have overhangs on the gate stack 304a including the air gaps 316. The insulation layer and the capping insulation layer 371 may be planarized to form the insulation layer 375.

Seventh Exemplary Method Embodiment

FIGS. 10A to 10D illustrate vertical sectional in stages of a method of fabricating a semiconductor device according to a yet further exemplary embodiment. This embodiment is similar to the previous embodiment described with reference to FIGS. 8A to 8D. Thus, differences between the present embodiment and the previous embodiment illustrated in FIGS. 8A to 8D will be mainly described hereinafter.

Figure 10A:
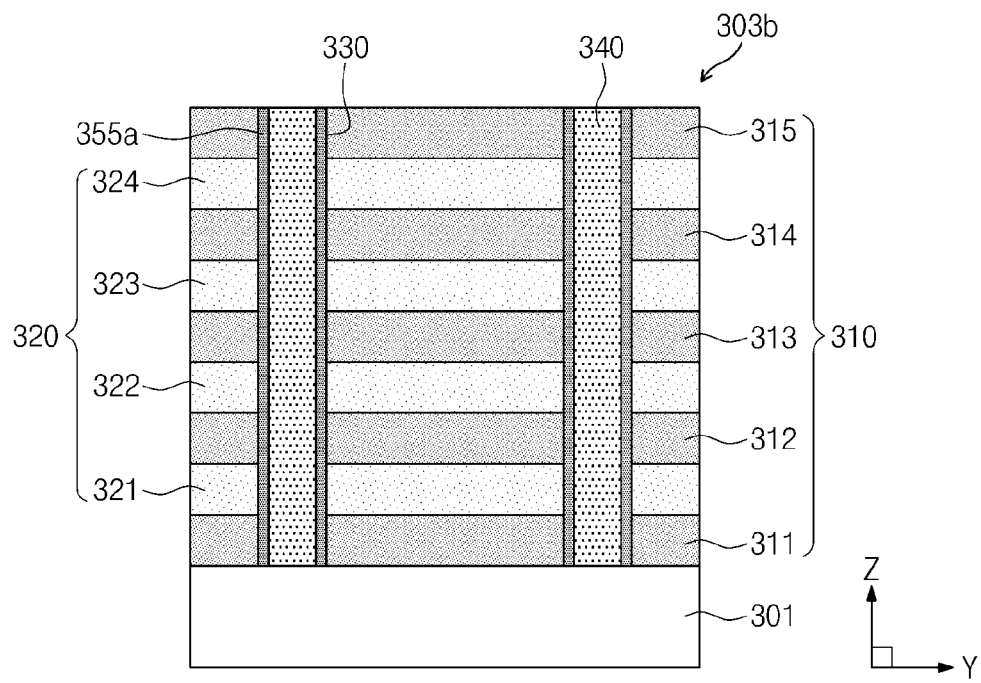
FIGS. 10A to 10D illustrate vertical sectional views of stages in a method of fabricating a semiconductor device, according to an exemplary embodiment.

Referring to FIG. 10A, a mold stack 303b may be formed on a substrate 301. The mold stack 303b may be formed to include a first sacrificial layer group 310 and a second sacrificial layer group 320. The first sacrificial layer group 310 may include first sacrificial layers 311-315. The second sacrificial layer group 320 may include second sacrificial layers 321-324 that are disposed between the first sacrificial layers 311-315, e.g., the first sacrificial layers 311-315 and the second sacrificial layers 321-324 may be alternately stacked.

Vertical channel holes 330 may be formed to penetrate the mold stack 303b. A first data storage layer 355a and a vertical channel 340 may be formed in each of the vertical channel holes 330. In an exemplary embodiment, the first data storage layer 355a may be formed to include a tunneling insulation layer that vertically extends along an inner wall of the vertical channel hole 340. In another embodiment, the first data storage layer 355a may be formed to include a blocking insulation layer and a tunneling insulation layer. In this case, the blocking insulation layer may be formed to vertically extend along an inner wall of the respective vertical channel holes 340, and the tunneling insulation layer may be formed to cover an inner sidewall of the blocking insulation layer.

Figure 10B:
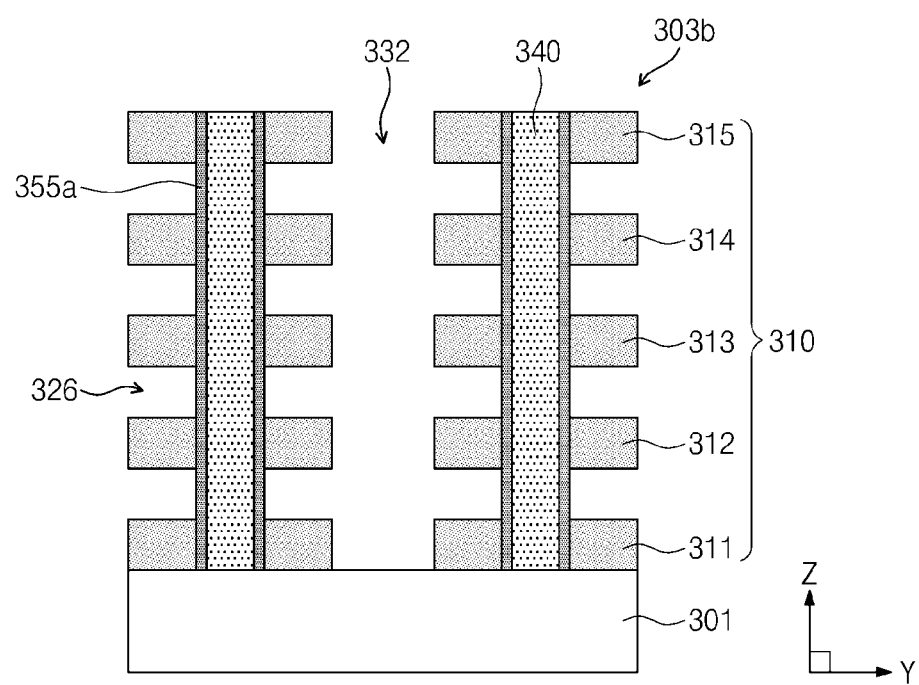

Referring to FIG. 10B, the mold stack 303b may be patterned to form word line cuts 332 between the vertical channels 340. The second sacrificial layers 321-324 may be selectively etched by supplying a wet etchant such as a phosphoric acid ($H_3PO_4$) solution through the word line cuts 332. As a result, recessed regions 326 may be formed between the first sacrificial layers 311-315. The recessed regions 326 may expose the first data storage layers 355a.

Figure 10C:
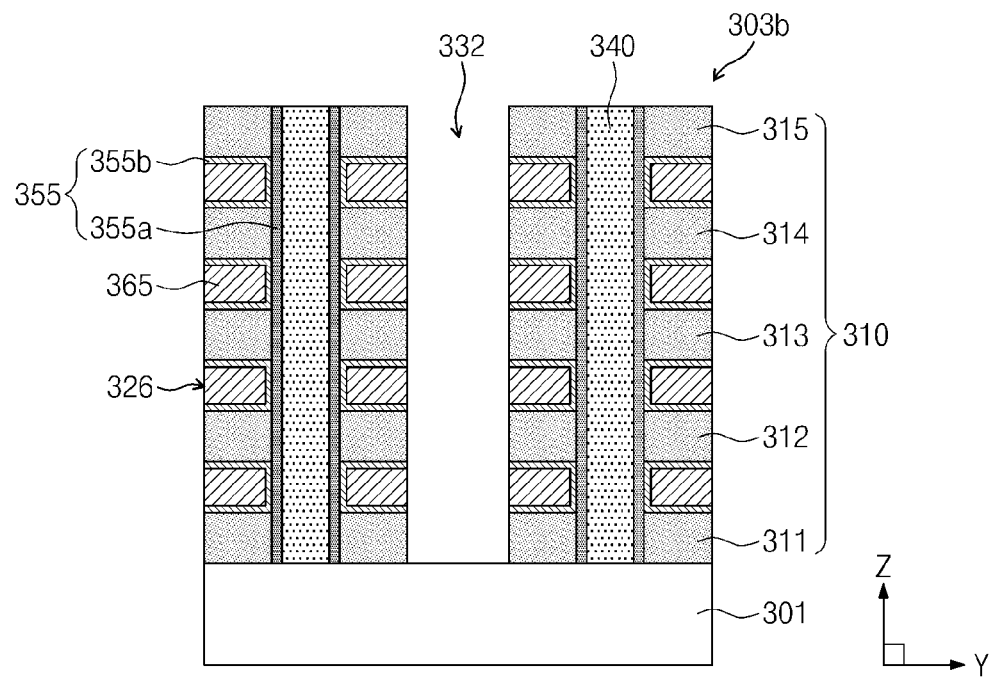

Referring to FIG. 10C, a second data storage layer 355b and a gate 365 may be formed in each of the recessed regions 326. In an exemplary embodiment, when the first data storage layer 355a include only a tunneling insulation layer, the second data storage layer 355b may include a trapping insulation layer formed to cover inner walls of the respective recessed regions 326 and a blocking insulation layer formed to cover the trapping insulation layer. In another exemplary embodiment, when the first data storage layer 355a include a tunneling insulation layer and a trapping insulation layer, the second data storage layer 355b may include a blocking insulation layer formed to cover inner walls of the respective recessed regions 326. As a result, the first and second data storage layers 355a and 355b may be formed, as illustrate in FIG. 2D. That is, the first data storage layer 355a may be formed to vertically extend along the respective vertical channels 340, and the second data storage layer 355b may be formed to cover inner walls of the respective recessed regions 326. The first and second data storage layers 355a and 355b may constitute the data storage layer 355.

Figure 10D:
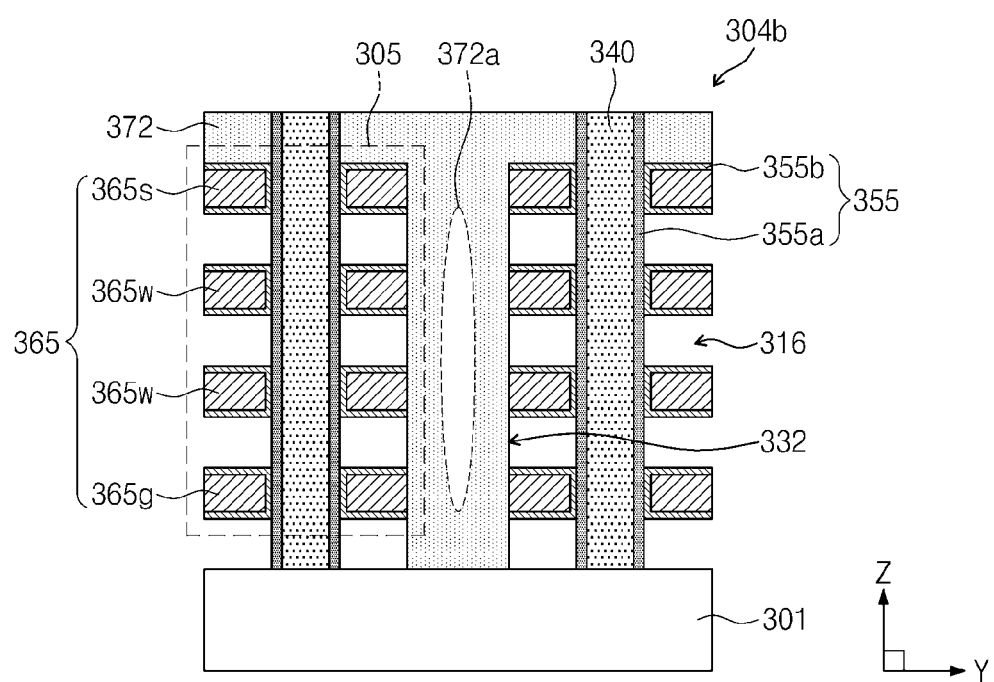

Referring to FIG. 10D, the first sacrificial layers 311-315 may be selectively etched by, e.g., supplying a hydrofluoric acid (HF) solution or a mixture of a hydrofluoric acid (HF) solution and a nitric acid ($HNO_3$) solution through the word line cuts 332. Thus, air gaps 316 may be formed between the gates 365 that are vertically stacked.

The gates 365 may include at least one string selection gate 365s, a plurality of memory gates 365w, and at least one ground selection gate 365g. Each of the string selection gate 365s and the ground selection gate 365g may constitute a non-memory transistor together with the corresponding vertical channel 340 and the corresponding data storage layer 355. Each of the memory gates 365w may constitute a memory transistor together with the corresponding vertical channel 340 and the corresponding data storage layer 355. The non-memory transistors and the memory transistors, which are vertically stacked along one vertical channel 340, may constitute a single cell string 305. As a result, a gate stack 304b including the cell strings 305 may be formed on the substrate 301.

An insulation layer 372, e.g., a silicon oxide layer, may be formed to fill the word line cuts 332 on the substrate 301 having the cell strings 305. The insulation layer 372 may exhibit a poor strep coverage characteristic. In this case, the insulation layer 372 may have a void 372a in each of the word line cuts 332.

Eighth Exemplary Method Embodiment

Figure 11A:
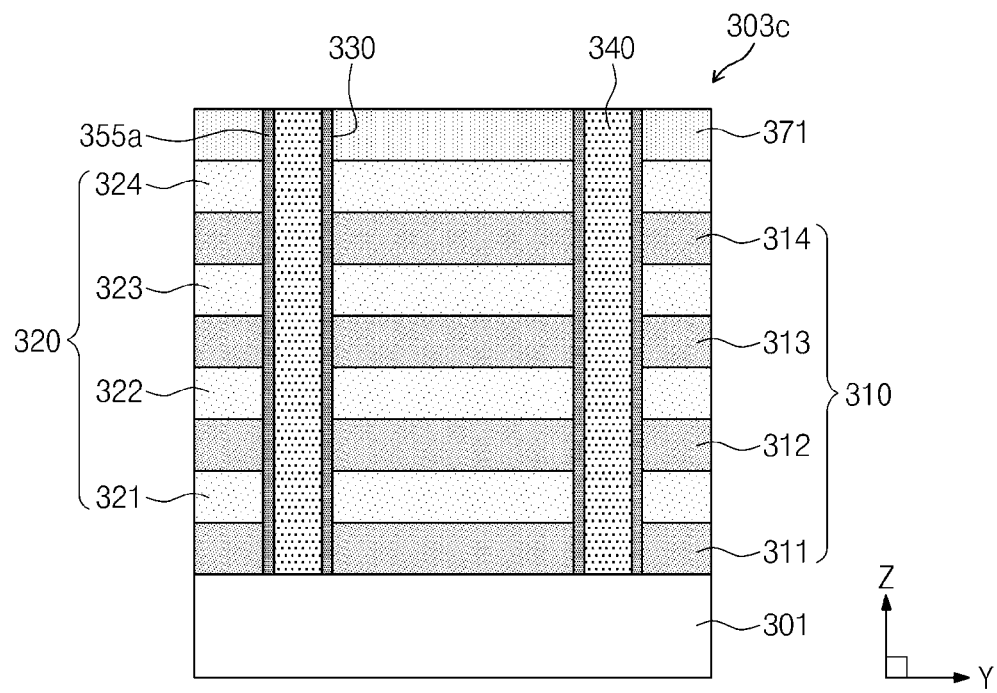
FIGS. 11A to 11C illustrate vertical sectional views of stages in a method of fabricating a semiconductor device, according to an exemplary embodiment.
Figure 11B:
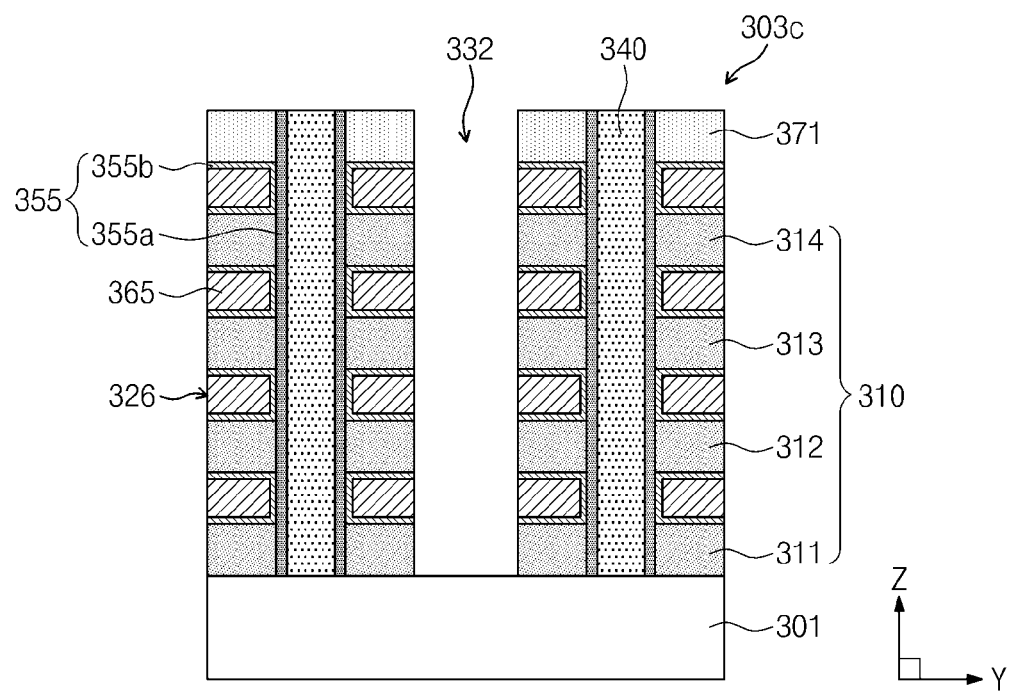
Figure 11C:
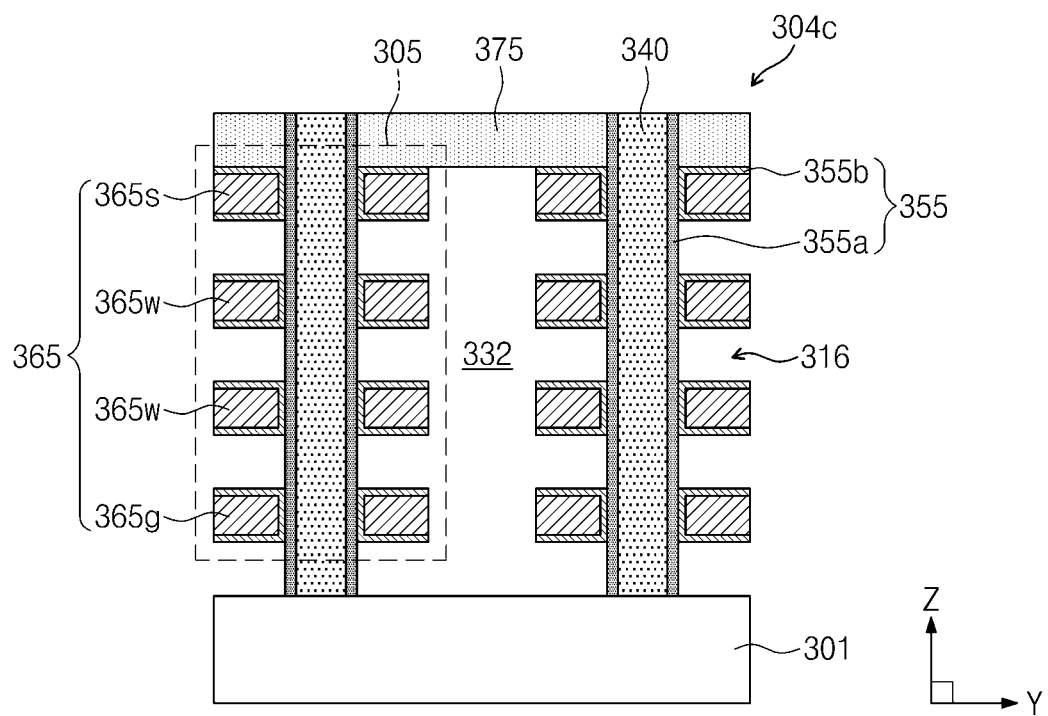

FIGS. 11A to 11C illustrate vertical sectional views of stages in a method of fabricating a semiconductor device according to a still further exemplary embodiment. This embodiment is similar to the previous embodiment described with reference to FIGS. 10A to 10D. Thus, differences between the present embodiment and the previous embodiment illustrated in FIGS. 10A to 10D will be mainly described hereinafter.

Referring to FIG. 11A, a mold stack 303c may be formed on a substrate 301. The mold stack 303c may be formed using the same manners as described with reference to FIG. 9A. That is, the mold stack 303c may be formed to include a capping insulation layer 371 acting as a topmost layer of the mold stack 303c. Vertical channel holes 330 penetrating the mold stack 303c may be formed using the same manners as illustrated in FIG. 10A. A first data storage layer 355a and a vertical channel 340 may be formed in each of the vertical channel holes 330.

Referring to FIG. 11B, word line cuts 332, recessed regions 325, second data storage layers 355b, and gates 365 may be formed using the same and/or substantially the same stages as described with reference to FIGS. 10B and 10C. The first and second data storage layers 355a and 355b may constitute a data storage layer 355.

Referring to FIG. 11C, the first sacrificial layers 311-314 may be selectively wet-etched to form air gaps 316 using the same manners as illustrated in FIG. 10D. The gates 365 may include at least one string selection gate 365s, a plurality of memory gates 365w, and at least one ground selection gate 365g. Each of the string selection gate 365s and the ground selection gate 365g may constitute a non-memory transistor together with the corresponding vertical channel 340 and the corresponding data storage layer 355. Each of the memory gates 365w may constitute a memory transistor together with the corresponding vertical channel 340 and the corresponding data storage layer 355. The non-memory transistors and the memory transistors, which are vertically stacked along one vertical channel 340, may constitute a single cell string 305. As a result, a gate stack 304c including the cell strings 305 may be formed on the substrate 301.

An insulation layer 375 may be formed on the substrate 301 having the strings 305. The insulation layer 375 may be formed to have such that it closes, e.g., seals, upper openings of the word line cuts 332, e.g., as illustrated in FIG. 5E.

Ninth Exemplary Method Embodiment

FIGS. 12A to 12D illustrate vertical sectional views of stages in a method of fabricating a semiconductor device according to a still yet further exemplary embodiment.

Figure 12A:
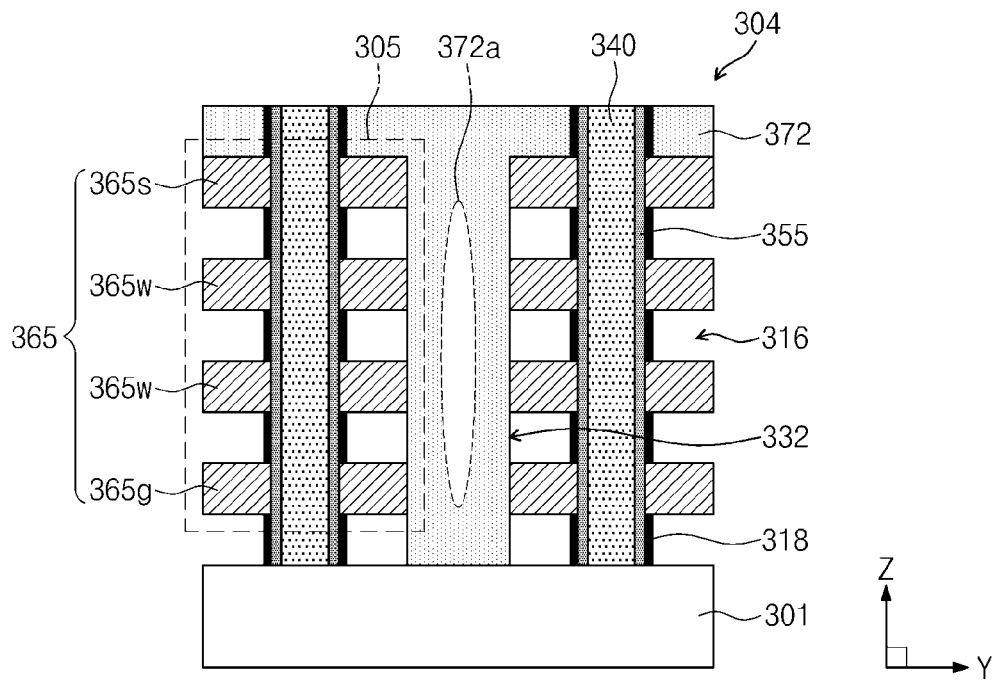
FIGS. 12A to 12D illustrate vertical sectional views of stages in a method of fabricating a semiconductor device, according to an exemplary embodiment.

Referring to FIG. 12A, a gate stack 304 may be formed on a substrate 301. The gate stack 304 may be formed using the same and/or substantially the same stages as described with reference to FIGS. 8A to 8D. In this case, a protection layer 318 may be additionally formed to cover data storage layers 255 that are exposed by air gaps 316. The protection layer 318 may be formed using the same manners as illustrated in FIG. 6A. For example, vertical channel holes 330 may be formed using the same and/or substantially the same stages as illustrated in FIG. 8A. Sidewalls of the first sacrificial layers 311-315 exposed by the vertical channel holes 330 may be oxidized to form the protection layer 318, e.g., as described with reference to FIG. 6A. The protection layer 318 may reduce the possibility of and/or prevent vertical channels 340 and data storage layers 355 formed in the vertical channel holes 330 from being damaged during a wet etching process for removing the first sacrificial layers.

Figure 12B:
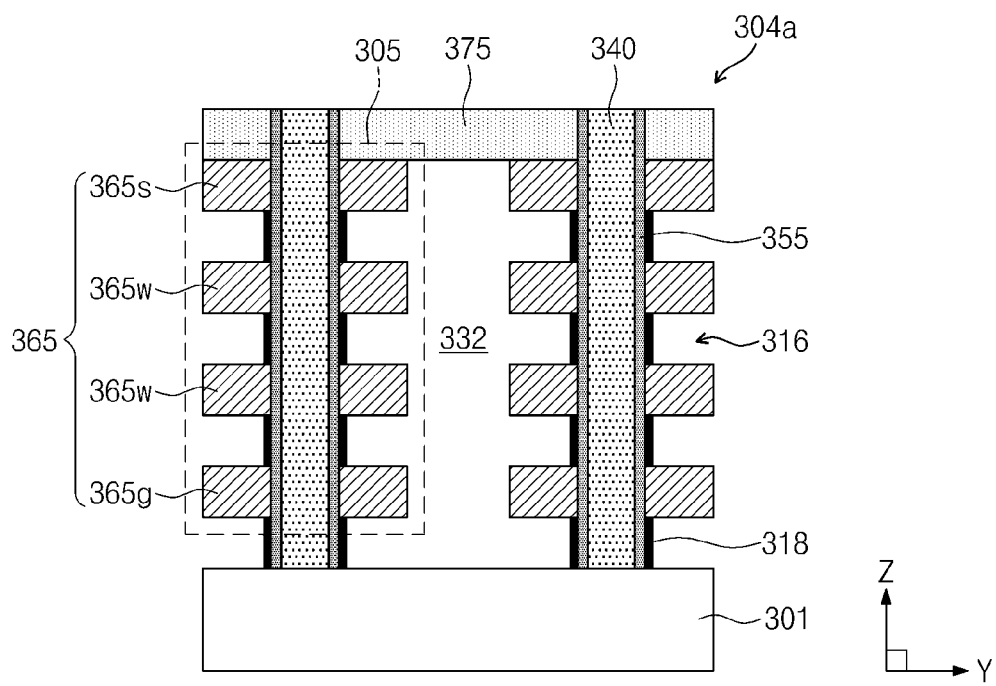

Referring to FIG. 12B, in the event that a gate stack 304a is formed using the same and/or substantially the same stages as described with reference to FIGS. 9A to 9D, the protection layer 318 covering data storage layers 355 exposed by air gaps 316 between the gates 365 may be additionally formed. The protection layer 318 may be formed using the same and/or substantially the same stages as described with reference to FIG. 7A. Further, an insulation layer 375 may be formed to overlap the word line cuts 332. The insulation layer 375 may extend between two adjacent vertical channels 340.

Figure 12C:
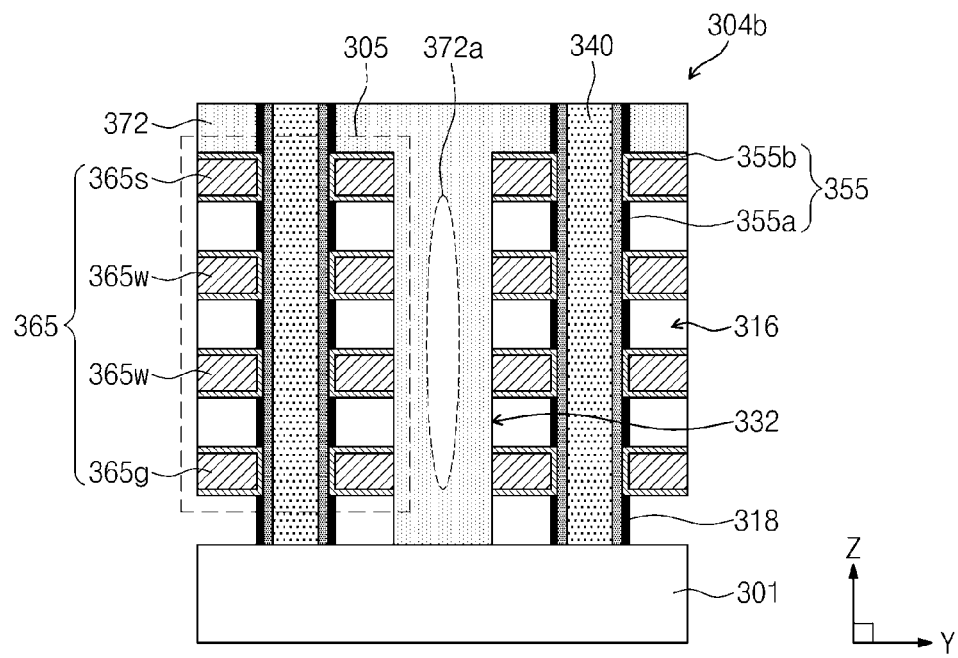

Referring to FIG. 12C, in the event that a gate stack 304b is formed using the same and/or substantially the same stages as described with reference to FIGS. 10A to 10D, the protection layer 318 covering first data storage layers 355a exposed by air gaps 316 between the gates 365 may be additionally formed. The protection layer 318 may be formed using the same and/or substantially the same stages as described with reference to FIG. 6A. An insulation layer 372 may be formed in the word line cuts 332. In an embodiment, the insulation layer 372 may be formed using a PVD technique. In an exemplary embodiment, the insulation layer 372 may exhibit a poor step coverage characteristic. The insulation layer 372 may be formed to have a void 372a in each of the word line cuts 332.

Figure 12D:
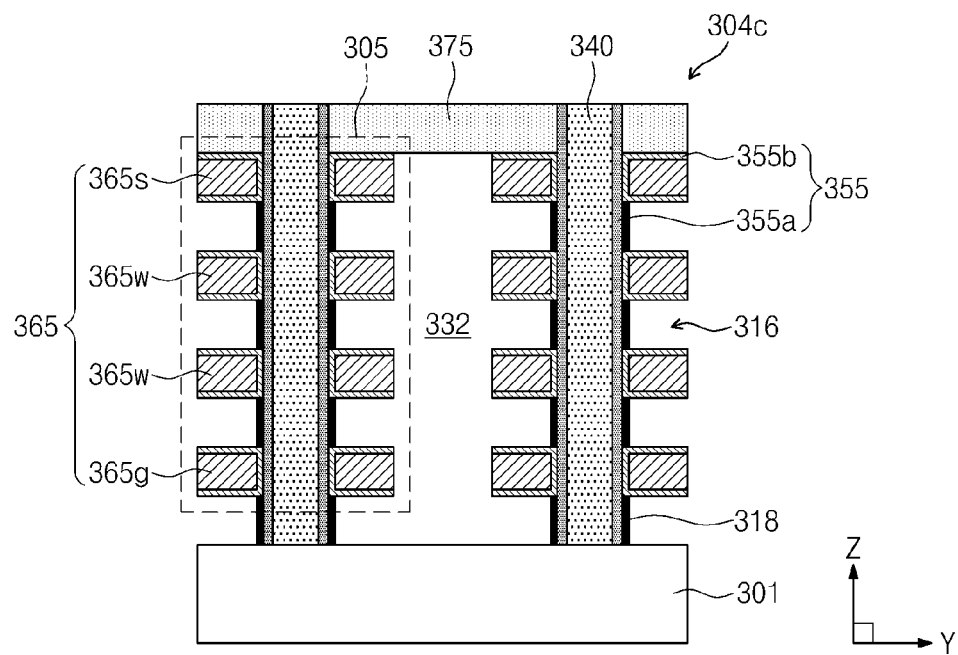

Referring to FIG. 12D, in the event that a gate stack 304c is formed using the same and/or substantially the same stages as described with reference to FIGS. 11A to 11C, the protection layer 318 covering data storage layers 355 exposed by air gaps 316 between the gates 365 may be additionally formed. The protection layer 318 may be formed using the same and/or substantially the same stages as described with reference to FIG. 7A.

Exemplary Application Embodiments

Figure 13A:
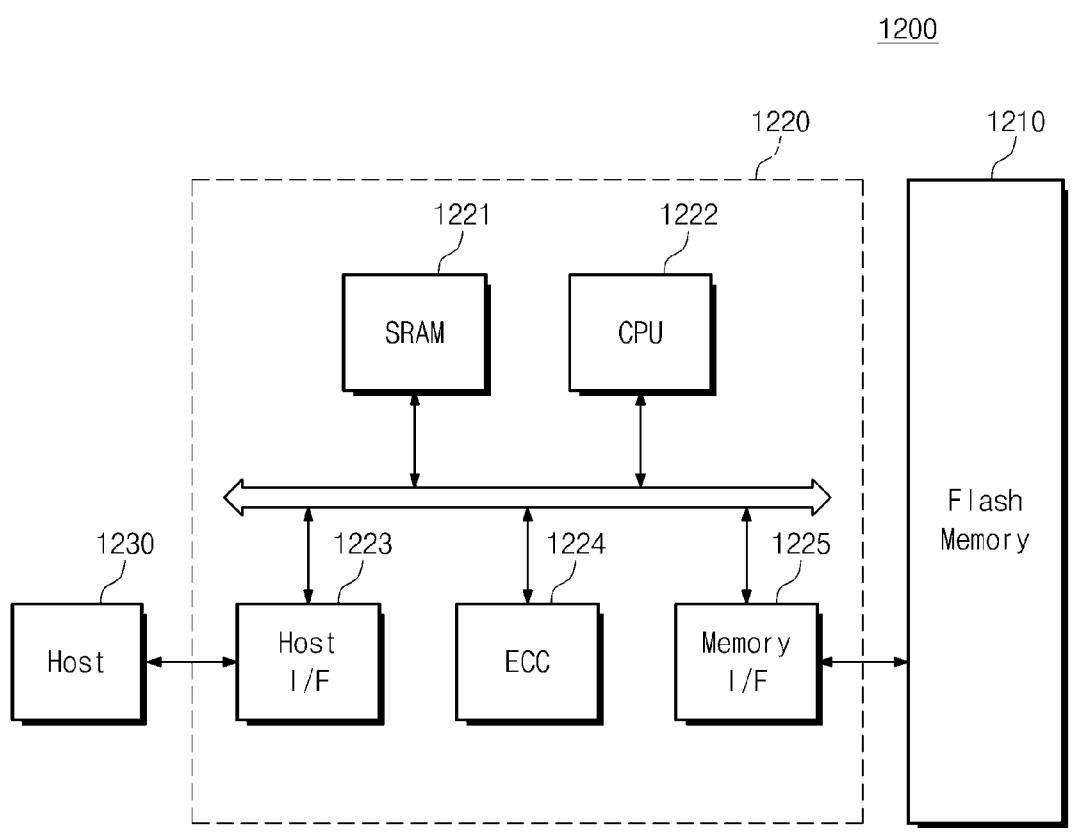
FIGS. 13A and 13B illustrate block diagrams of electronic products including a semiconductor device according to any one of the embodiments.
Figure 13B:
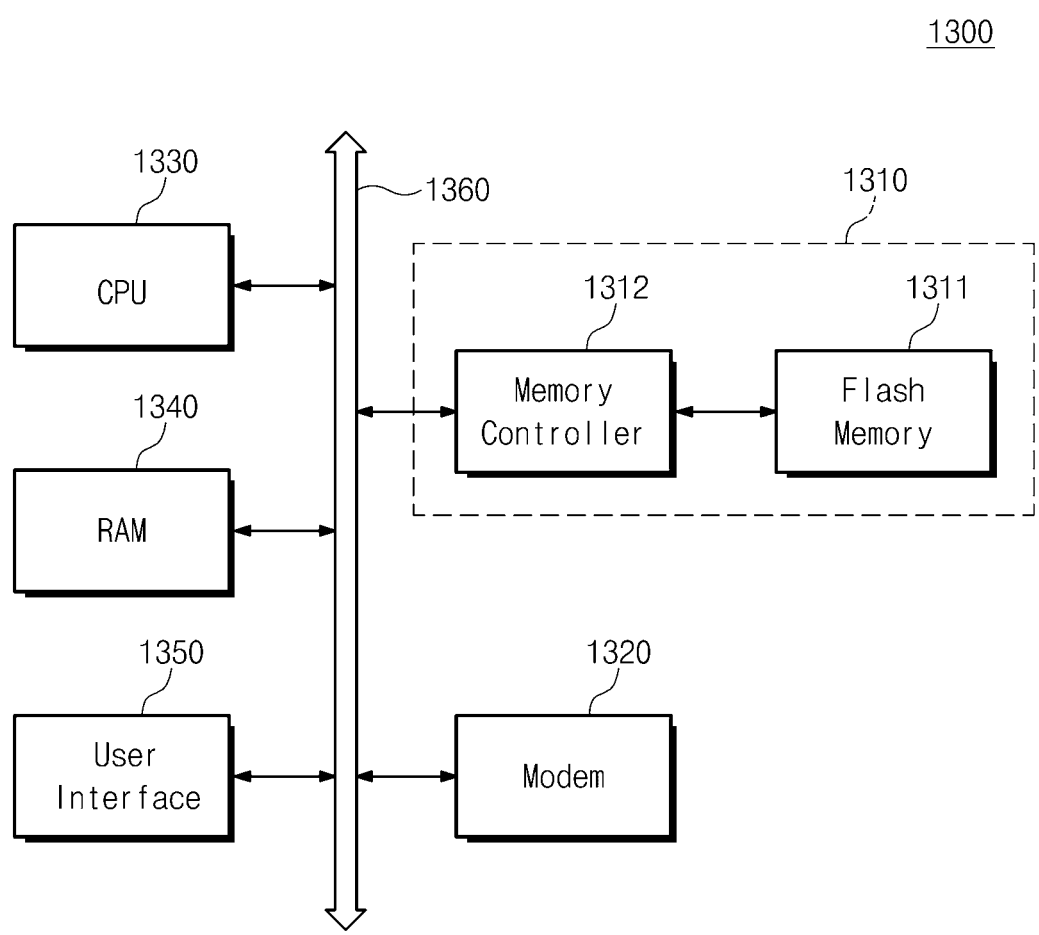

FIGS. 13A and 13B illustrate block diagrams of electronic products including a semiconductor device according to an exemplary embodiment.

Referring to FIG. 13A, a memory card 1200 may include a flash memory device 1210, e.g., to provide a high capacity of data storage ability. The flash memory device 1210 may include at least one of the semiconductor memory devices according to exemplary embodiments. For example, the flash memory device 1210 may include a vertical NAND-type flash memory device.

The memory card 1200 may include a memory controller 1220 that may control data communication between a host 1230 and the flash memory device 1210. The memory card 1200 may include a static random access memory (SRAM) device 1221 and a central processing unit (CPU) 1222. The SRAM device 1221 may be used as an operation memory of the CPU 1222. The memory controller 1220 may further include a host interface unit 1223. The host interface unit 1223 may be configured to include a data communication protocol. The memory controller 1220 may further include an error check and correction (ECC) block 1224. The ECC block 1224 may detect and correct errors of data which are read out from the flash memory device 1210. The memory controller 1220 may further include a memory interface unit 1225. The memory interface unit 1225 may control the communication between the memory controller 1220 and the flash memory device 1210. The central processing unit (CPU) 1222 may control overall operations of the memory controller 1220. Even though not shown in the drawings, the memory card 1200 may further include a read only memory (ROM) device that stores code data to interface with the host 1230.

Referring to FIG. 13B, an information processing system 1330 according to exemplary embodiments may include at least one of the semiconductor memory devices described in the above exemplary embodiments. For example, the information processing system 1330 may include a flash memory system 1310 having a vertical NAND-type flash memory device according to an exemplary embodiment. The information processing system 1330 may include a mobile system, a computer or the like.

In an embodiment, the information processing system 1330 may include a modulator-demodulator (MODEM)

1320, a central processing unit (CPU) 1330, a random access memory (RAM) device 1340, and a user interface unit 1350 that communicate with each other through a data bus 1360. The data bus 1360 may correspond to a path through which electrical signals are transmitted. The flash memory system 1310 may include a flash memory device 1311 and a memory controller 1312. The memory controller 1312 may control overall operations of the flash memory device 1311, and the flash memory device 1311 may store data processed by the CPU 1330 or data transmitted from external system. The information processing system 1330 may be applicable to a memory card, a solid state disk, a camera image sensor, or an application chipset. In particular, the flash memory system 1310 may include the solid state disk. In this case, the information processing system 1330 may be stable and reliable since the solid state disk may stably store large data.

According to the embodiments set forth above, gates vertically stacked may be spaced apart and electrically insulated from each other by air gaps. Thus, parasitic capacitance between the gates may be significantly reduced to enhance operation speed of a semiconductor memory device. In addition, a protection layer may be formed to cover sidewalls of vertical channels. Thus, the protection layer may reduce the possibility of and/or prevent the vertical channels from being damaged by a subsequent etching process. As a result, the protection layer may lead to an improvement of yield. Moreover, memory cells of the semiconductor memory devices according to the above embodiments may be arranged in a three dimensional array to increase an integration density of the semiconductor memory devices. That is, highly integrated semiconductor memory devices may be realized.

By way of summation and review, semiconductor devices are being continuously scaled down. The integration density of two dimensional semiconductor devices, e.g., planar semiconductor devices may be mainly determined by a planar area that a unit memory cell occupies. Accordingly, the integration density of the two dimensional semiconductor devices may be affected by, e.g., a technology for forming fine and small patterns. However, realizing fine patterns in two dimensional semiconductor devices may result in increasing manufacturing costs and/or high priced apparatuses. Therefore, there may be some limitations in increasing the integration density of the two dimensional semiconductor devices. Therefore, three dimensional semiconductor devices including memory cells arranged in a three dimensional array have been proposed to overcome the above limitations.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor memory device, the method comprising:
    forming a mold stack on a substrate, the mold stack including first sacrificial layers and second sacrificial layers alternately stacked on the substrate;
    forming a plurality of vertical channels that penetrate the mold stack and that contact the substrate;
    patterning the mold stack to form word line cuts between the vertical channels, the word line cuts exposing the substrate;
    removing one of the first and second sacrificial layers to form recessed regions in the mold stack;
    forming gates in the recessed regions;
    forming a data storage layer, at least a portion of the data storage layer being formed between the vertical channels and the gates;
    forming air gaps between the gates by removing the other of the first and second sacrificial layers; and
    forming an insulation layer in the word line cuts.

2. The method as claimed in claim 1, wherein:
    the first sacrificial layers are formed of silicon germanium layers, and
    the second sacrificial layers are formed of silicon nitride layers.

3. The method as claimed in claim 2, wherein:
    the recessed regions are formed by removing the second sacrificial layers using a first etchant supplied through the word line cuts, and
    the gates are formed by filling the recessed regions with a conductive material.

4. The method as claimed in claim 3, wherein the air gaps are formed by removing the first sacrificial layers using a second etchant supplied through the word line cuts.

5. The method as claimed in claim 3, wherein forming the data storage layer includes sequentially forming a tunneling insulation layer, a trapping insulation layer, and a blocking insulation layer in the recessed regions before forming the gates therein or on sidewalls of vertical channel holes before forming the vertical channels therein.

6. The method as claimed in claim 3, wherein forming the data storage layer includes:
    forming a tunneling insulation layer on sidewalls of vertical channel holes before forming the vertical channels therein,
    forming a blocking insulation layer in the recessed regions before forming the gates therein, and
    forming a trapping insulation layer, the trapping insulation layer being formed on the tunneling insulation layer after forming the tunneling insulation layer on the sidewalls of the vertical channel holes or the trapping insulation layer being formed in the recessed regions before forming the blocking insulation layer in the recessed regions.

7. The method as claimed in claim 1, wherein forming the insulation layer includes depositing an insulating material with a physical vapor deposition technique to contact the substrate.

8. The method as claimed in claim 1, further comprising:
    forming a plurality of vertical channel holes that penetrate the mold stack and expose the substrate, and
    oxidizing the first sacrificial layers exposed by the vertical channel holes to form a plurality of sacrificial oxide layers prior to forming the vertical channels in the vertical channel holes.

9. The method as claimed in claim 1, further comprising forming a capping insulation layer on the mold stack.

10. The method as claimed in claim 9, wherein:
    patterning the mold stack to form the word line cuts includes patterning the capping insulation layer,
    forming an insulation layer pattern which includes forming overhanging portions that overhang ends of the capping insulation layer adjacent to the word line cuts, and the insulation layer pattern being spaced apart from the substrate and closing upper openings of the word line cuts.

11. The method as claimed in claim 1, further comprising forming a protection layer on sidewalls of the vertical channels exposed by the air gaps.

12. A method of fabricating a semiconductor memory device, the method comprising:
- forming a mold stack on a substrate, the mold stack including first sacrificial layers and second sacrificial layers alternately stacked on the substrate;
- forming a plurality of vertical channels that penetrate the mold stack;
- patterning the mold stack to form word line cuts between the vertical channels, the word line cuts exposing the substrate;
- removing one of the first and second sacrificial layers to form recessed regions in the mold stack;
- filling a conductive material in the recessed regions;
- forming air gaps between the recessed regions filled with the conductive material by removing the other of the first and second sacrificial layers; and
- forming an insulation layer in the word line cuts to close the word line cuts, at least a portion of the word line cuts between an uppermost layer of the mold stack and the substrate being unfilled with the insulation layer.

13. The method as claimed in claim 12, wherein filling the conductive material in the recessed regions includes forming gates such that adjacent gates are spaced apart by one of the air gaps, the insulation layer, and a void in the word line cuts.

14. The method as claimed in claim 12, wherein forming the insulation layer includes having the air gaps between the insulation layer and the vertical channels.

15. The method as claimed in claim 14, wherein the insulation layer leaves voids within the word line cuts.

16. The method as claimed in claim 12, wherein, when closing the word line cuts, the insulation layer is spaced apart from the substrate to form the unfilled portions of the word line cuts and the air gaps are continuous with unfilled portions of the word line cuts.

* * * * *